United States Patent
Morrison, Jr. et al.

(10) Patent No.: US 11,054,386 B2
(45) Date of Patent: Jul. 6, 2021

(54) VESFET CHEMICAL SENSOR AND METHODS OF USE THEREOF

(71) Applicant: The Charles Stark Draper Laboratory, Inc., Cambridge, MA (US)

(72) Inventors: Richard H. Morrison, Jr., Taunton, MA (US); Andrew P. Magyar, Arlington, MA (US)

(73) Assignee: THE CHARLES STARK DRAPER LABORATORY, INC., Cambridge, MA (US)

( * ) Notice: Subject to any disclaimer, the term of this patent is extended or adjusted under 35 U.S.C. 154(b) by 557 days.

(21) Appl. No.: 15/907,891

(22) Filed: Feb. 28, 2018

(65) Prior Publication Data

US 2018/0252675 A1     Sep. 6, 2018

Related U.S. Application Data

(60) Provisional application No. 62/466,673, filed on Mar. 3, 2017.

(51) Int. Cl.
*G01N 27/414* (2006.01)
*H01L 29/78* (2006.01)
(Continued)

(52) U.S. Cl.
CPC ..... *G01N 27/4146* (2013.01); *G01N 27/4145* (2013.01); *H01L 29/0692* (2013.01);
(Continued)

(58) Field of Classification Search
CPC ............. H01L 29/785; H01L 29/7831; H01L 29/66795; H01L 29/7881; H01L 29/0692;
(Continued)

(56) References Cited

U.S. PATENT DOCUMENTS

| 2009/0127589 A1* | 5/2009 | Rothberg | G01N 27/4148 257/253 |
| 2010/0204062 A1* | 8/2010 | Thompson | B82Y 35/00 506/16 |
| 2012/0301360 A1 | 11/2012 | Meinhold | |

FOREIGN PATENT DOCUMENTS

KR   2016127310 A   * 11/2016   ............. G01N 27/26

OTHER PUBLICATIONS

4156C Supporting Information.*

(Continued)

*Primary Examiner* — Gurpreet Kaur

(74) *Attorney, Agent, or Firm* — Hamilton, Brook, Smith & Reynolds. P.C.

(57) ABSTRACT

Aspects of the invention are directed to chemical and biological molecule sensing devices, methods of fabricating the chemical sensor devices, and methods of using those devices to detect chemical and biological molecules. The chemical sensor device may comprise a chemically-sensitive vertical slit field effect transistor (VeSFET) with a chemical recognition element attached to a gate structure and/or a channel of the VeSFET. The recognition element may be capable of binding to a chemical of interest such that the binding of the chemical to the recognition element results in a modification of current flow of the VeSFET, resulting in a detectable signal. The chemical sensor device may further comprise an amplifier configured to receive the detectable signal and produce an amplified signal, and an (Continued)

analog-to-digital converter (ADC) configured to receive the amplified signal and to produce a digital signal that represents the amplified signal.

13 Claims, 20 Drawing Sheets

(51) Int. Cl.
 *H01L 29/66* (2006.01)
 *H01L 29/06* (2006.01)
 *H01L 29/778* (2006.01)
(52) U.S. Cl.
 CPC .... *H01L 29/66795* (2013.01); *H01L 29/7788* (2013.01); *H01L 29/785* (2013.01); *H01L 29/7855* (2013.01)
(58) Field of Classification Search
 CPC .......... H01L 29/66825; H01L 29/7788; H01L 29/7855; H01L 257/1203; G01N 27/4145; G01N 27/4146; G01N 27/414–417
 See application file for complete search history.

(56) References Cited

OTHER PUBLICATIONS

International Search Report and Written Opinion ofr PCT/US2018/020193 dated Jun. 8, 2018, entitled "VeSFET Chemical Sensor and Methods of Use Thereof".

Peisert, M.A., "Analysis of the Properties of hte VeSFET transistor for use in the sensor array", Abstract of Engineer's Thesis, pp. 1-3, Jan. 2, 2014.

Staniewski, M., et al. "Usefulness of VeSTIC devices for low-noise and radiation hard 3D integrated circuits" 2014 Proceedings of the 21st International Conference Mixed Design of Integrated Circuits and Systems (MIXDES), pp. 256-360, Jun. 2, 2014.

Maly, W., et al., "Twin gate,veritical slit FET (VeSFET) for highly periodic layout and 3D integration", Mixed Design Circuits and Systems (MIXDES), 2011 Proceedings of the 18th International Conference, IEEE, pp. 145-150, Jun. 16, 2011.

Ahn, J., et al., "Double-Gate Nanowire Field Effect Transistor for a Biosensor" NANO Letters, vol. 10, No. 8, Aug. 11, 2010.

* cited by examiner

VESFET CHEMICAL SENSOR AND METHODS OF USE THEREOF

RELATED APPLICATIONS

This application claims the benefit of U.S. Provisional Application No. 62/466,673, filed on Mar. 3, 2017. This application is related to U.S. Provisional Application No. 62/580,379, entitled "Integrated Process Flow For Semiconductor Devices," filed on Nov. 1, 2017, and Provisional Application No. 62/580,401, entitled "VeSFlash Non-Volatile Memory," filed on Nov. 1, 2017. The entire teachings of the above applications are incorporated herein by reference.

BACKGROUND

Bio sensors and chemical sensors have been produced using conventional field effect transistors (FET) for a number of biological and chemical methods. Such sensors, however, are often bulky, power-hungry and lack the sensitivity to be useful for some analytical methods, for example, detecting certain small inorganic molecules, or proteins and oligonucleotides.

SUMMARY

The described example embodiments of the invention are directed to chemical and biological molecule sensing devices with improved signal to noise ratio and transistor sensitivity, methods of fabricating the chemical sensor devices and methods of using those devices to detect chemical and biological molecules. In particular, the described embodiments relate to the modification of a specific type of field effect transistor (FET), a vertical slit field effect transistor, referred to herein as a VeSFET (see, e.g., U.S. Pat. Nos. 9,153,689, and 9,640,653) to create a gap between the conductive channel and the controlling gates to modulate the drain source current flow. Vertical slit transistors typically have an "off" current of $1 \times 10^{-14}$ amps (10 fA) and the "on" current of $1 \times 10^{-5}$ amps (10 µA) as compared to standard FET technology which have an "off" current of $1 \times 10^{-9}$ amps (1 nA) and an "on" current of $1 \times 10^{-5}$ amps (10 µA). The increase in the on/off ratio of a VeSFET improves the associated signal-to-noise ratio and improves the transistor sensitivity. Since chemical sensors require increased sensitivity to detect molecules in sample (especially biological samples), VeSFETs are particularly suitable for use in chemical sensors. As used herein, the term "chemical sensor" encompasses both chemical (organic and inorganic) and biological molecule sensors, and the term "chemical analytes" encompasses both chemical and biological analytes of interest.

Specifically, the chemical sensing device of the described embodiments comprises a VeSFET having a chemically sensitive electrode gate or channel as a key feature. A recognition element sensitive to the chemical to be detected, such as a protein or oligonucleotide, is attached to the VeSFET gate or channel. The recognition element recognizing, binding and/or interacting with the chemical of interest causes a detectable change in electrical current flowing through the channel of the VeSFET.

As described herein, the chemical sensing device may comprise a Silicon-on-Insulator (SOI) substrate that is suitable for fabrication of the VeSFET. A VeSFET is then formed upon the substrate, the VeSFET having at least one gate electrode structure or channel FIGS. 1A and 1B show a top view and a perspective view, respectively, of an example VeSFET embodiment. The example VeSFET is a four terminal device, based on unit circle 102 of radius r as shown in FIG. 1A. A potential applied to gates G1 and G2 controls the current flowing through the channel 104 from drain (D) to source (S). The current flows through the bulk of the channel 104, not along the gate oxide interface. In the example embodiment of FIGS. 1A and 1B, the gate wall is shown on the <110> plane, although the gate wall of an alternative device could be rotated to the <100> plane.

In general, the VeSFET device may comprise an n-VeSFET or a p-VeSFET. The n-VeSFET has at least one p-type gate electrode, and the p-VeSFET has at least one n-type gate electrode. The VeSFETs of the described embodiments may have two p-type, or two n-type gate electrodes. In general, a VeSFET is an enhancement mode device. For n-channel devices, the drain to source current is modulated by the p-type gate electrodes, and for p-type devices, the drain to source current is modulated by the n-type gate electrodes.

A chemically-sensitive VeSFET may be formed by immobilizing a chemical recognition element onto the gate structure or channel structure of the VeSFET. The recognition element is capable of recognizing (by binding to and/or reacting with) a chemical analyte of interest. A binding event may shift the band structure of the VeSFET device, thereby causing a change in the device characteristics. For example, the interaction between the chemical analyte and the recognition element may modify current flow through the VeSFET, resulting in a detectable signal.

FIG. 2A illustrates a VeSFET device without chemical sensing capability. FIGS. 2B and 2C illustrate a chemically-sensitive VeSFET with a chemically-sensitive gate, and FIG. 2D illustrates a chemically-sensitive VeSFET with a chemically-sensitive channel. The example embodiments of FIGS. 2A through 2D are sectional views taken by a plane that is perpendicular to the top surface of the SOI wafer and slicing through the two gates.

FIG. 2A shows a silicon wafer 202, a first gate (G1) 204, a second gate (G2) 206, a channel 208 and a gate-channel oxide interface 210.

FIG. 2B shows the same VeSFET components as shown in FIG. 2A, but with a chemical recognition element 212a disposed on a top portion of gate G1 and a chemical recognition element 212b disposed on a top portion of gate G2. Although the example embodiment of FIG. 2B shows the chemical recognition element 212 disposed on both gates, alternative embodiments may include the chemical recognition element disposed on only one gate. For this embodiment, interaction with an analyte occurs at the top portion of one or both of gates G1 and G2.

FIG. 2C shows a VeSFET with a split gate architecture, and with a chemical recognition element 214a disposed on a side wall of each of the split gates.

FIG. 2D shows a chemical recognition element 216 disposed on the channel 208.

The chemical recognition element may be any molecule suitable for attachment to the gate electrode, or channel, and in particular may be a protein, peptide, or antibody with specificity for the chemical analyte, or an antibody binding fragment thereof, an oligonucleotide, an aptamer, enzyme or a DNAzyme (also known as deoxyribozyme or DNA enzyme). In other embodiments, the recognition element may recognize and/or bind to inorganic molecules such as metals (for example, lead or uranium) or chemical toxins.

In one embodiment, the sensor has dual electrode gates wherein one gate can serve as a control and a second gate can serve as the "sense" gate, which may be used for as a "control" for external environmental factors, to facilitate improved detection specificity. For example, the control gate may be used to reduce background noise during a detection event. In another embodiment the signal generated by the recognition event can be amplified. To amplify the signal, the binding event may yield an electron lone electron, or release an electron donor or acceptor, to enhance the change in the device characteristics.

In another embodiment, an array of chemical sensor VeSFETs with a particular chemical recognition element can be fabricated on a substrate to amplify the detection of a particular analyte of interest. Alternatively, the array of VeSFETs can comprise VeSFETs, or groups of VeSFETs, each with a distinct chemical recognition element, to detect multiple analytes in a single sample.

Also encompassed by the described embodiments is a chemical sensor instrument which uses a chemical sensor VeSFET as the underlying sensing component.

Also encompassed by the described embodiments are methods of detecting a chemical analyte of interest in a sample using the device of the example embodiments described herein. The method comprises the steps of contacting the chemical sensor device with a sample containing the analyte of interest. Such a sample could be any biological sample (e.g., blood, plasma, serum, urine, cerebrospinal fluid) prepared in a manner to render it suitable for use with the sensors of the described embodiments. A sample could also be, for example, any liquid sample containing an analyte of interest such as waste water or paint.

The sample may be maintained in contact with the sensor under conditions sufficient for the analyte of interest to be recognized by, or bind to, the recognition element attached to the gate electrode structure or channel, whereby the recognition of/binding to the recognition element results in modification of current flow of the VeSFET, thereby resulting in a detectable signal. Detection of the signal generated by the recognition event can be detected by any suitable means which are known to those of skill in the art. When necessary, the signal can be amplified for increased sensitivity using means know to those of skill in the art.

Methods of fabricating the chemical sensors described herein are also encompassed by the described embodiments.

The chemical sensors described herein may be used in a variety of biological diagnostic assays and chemical detection assays and may provide increased sensitivity due to the direct electrical signal detection over conventional FET sensors.

In one aspect, the invention may be a chemical sensing instrument, comprising a chemically-sensitive vertical slit field effect transistor (VeSFET) formed on a silicon-on insulator (SOI) substrate. The chemical sensing instrument may further comprise a chemical recognition element attached to at least one of (i) a first gate structure of the VeSFET, (ii) a second gate structure of the VeSFET, and (iii) a channel of the VeSFET. The recognition element may be capable of binding to a chemical of interest such that the binding of the chemical to the recognition element results in a modification of current flow of the VeSFET resulting in a detectable signal. The chemical sensing instrument may further comprise an amplifier configured to receive the detectable signal and produce an amplified signal, and an analog-to-digital converter (ADC) configured to receive the amplified signal and to produce a digital signal that represents the amplified signal.

The chemical sensing instrument may further comprise one or more additional chemically-sensitive VeSFETs formed on the silicon-on insulator (SOI) substrate to form a chemical sensor array. At least one of the one or more additional VeSFETs may comprise an alternative chemical recognition element that is different from the chemical recognition element.

An example embodiment of the chemical sensing instrument may further comprise a detection system configured to measure the digital signal to produce a detection signal, compare the detection signal to a predetermined threshold, and produce a detection decision based on the comparison. In an alternative embodiment, the chemical sensing instrument may implement a 16 bit ADC, which provides over 32K of discreet measurement intervals. Such measurement capability is compatible with the standard voltammetry used in electrochemical analysis and ELSIA used biological analysis.

The chemical sensing instrument may further comprise a control component configured to one or both of (i) receive supervisory information from one or more external components, and (ii) distribute control and parametric information to at least one of the chemically-sensitive VeSFET, the amplifier and the ADC. The amplifier may comprise a series-coupled preamplifier and a primary amplifier. The preamplifier may be configured to receive a first signal from the chemically-sensitive VeSFET, and provide a second signal to the primary amplifier. The VeSFET may have dual electrode gates.

The VeSFET may be an n-channel VeSFET that has at least one gate with a p-type gate electrode. The VeSFET may be a p-channel VeSFET that has at least one gate with an n-type gate electrode.

The recognition element may be selected from the group consisting of: a protein, peptide, an antibody, or binding fragment thereof, an oligonucleotide, an aptamer, and enzyme and a DNAzyme.

In another aspect, the invention may be a chemical sensor device, comprising an array of one or more chemically-sensitive vertical slit field effect transistors (VeSFETs) formed on a silicon-on-insulator (SOI) wafer substrate. For each VeSFET of the array, a chemical recognition element may be attached to at least one of (i) a first gate structure of the VeSFET, (ii) a second gate structure of the VeSFET, and (iii) a channel of the VeSFET. The recognition element may be capable of binding to a chemical of interest such that the binding of the chemical to the recognition element results in a modification of current flow of the VeSFET resulting in a detectable signal.

The chemical sensor device may further comprise an amplifier configured to receive the detectable signal and produce an amplified signal, an analog-to-digital converter (ADC) configured to receive the amplified signal and to produce a digital signal that represents the amplified signal, and a control component configured to one or both of (i) receive supervisory information from one or more external components, and (ii) distribute control and parametric information to at least one of the chemically-sensitive VeSFET, the amplifier and the ADC.

In another aspect, the invention may be a method of detecting a chemical analyte of interest in a sample, comprising contacting the sample with a chemically-sensitive VeSFET sensitized with a chemical recognition element corresponding to the chemical analyte, and measuring the digital signal to produce a detection signal. The method may further comprise comparing the detection signal to a predetermined threshold, and producing a detection decision based on the comparing.

The method may further comprise arranging for conditions of the sample to be sufficient for the analyte of interest to bind to the recognition element. The chemical recognition element may be selected from the group consisting of: a protein, peptide, an antibody, a binding fragment of an antibody, an oligonucleotide, an aptamer, and enzyme and a DNAzyme. The recognition element may recognize an analyte selected from the group consisting of: an inorganic molecule or a metal. The method may further comprise amplifying the signal.

The chemically-sensitive VeSFET may comprise a chemically sensitive gate and a control gate, and the method further comprises applying a bias voltage to the control gate sufficient to cause a drain to source channel current (IDS) to be in a subthreshold region of the chemically-sensitive VeSFET.

In another aspect, the invention may be a method of fabricating a p-channel chemically-sensitive VeSFET, comprising providing a p-type silicon-on-insulator (SOI) wafer, depositing silicon nitride upon the SOI wafer, defining a drain to source (D-S) channel and at least one chemical mechanical planarization (CMP) buffer, and depositing n-type polysilicon gate electrodes. The method may further comprise polishing, with a CMP process, the silicon nitride, defining a gate region, depositing a field oxide, opening at least one source/drain (S/D) via, and for each S/D via, implementing a contact implant. The method may further comprise metallizing each contact implant, opening at least one gate, and applying a chemical recognition element to the opened gate.

In another aspect, the invention may be a method of fabricating an n-channel chemically-sensitive VeSFET, comprising providing an n-type silicon-on-insulator (SOI) wafer, depositing silicon nitride upon the SOI wafer, defining a drain to source (D-S) channel and at least one chemical mechanical planarization (CMP) buffer, and depositing p-type polysilicon gate electrodes. The method may further comprise polishing, with a CMP process, the silicon nitride, defining a gate region, depositing a field oxide, opening at least one source/drain (S/D) via, and for each S/D via, implementing a contact implant. The method may further comprise metallizing each contact implant, opening at least one gate, and applying a chemical recognition element to the opened gate.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

The teachings of all patents, published applications and references cited herein are incorporated by reference in their entirety.

As described herein, chemical sensing devices are provided based upon modification and improvement of the vertical slit field effect transistor (VeSFET) technology. The chemical sensors of the described embodiments directly sense changes in conductivity, or electrons in solution, based upon a recognition event, i.e., interaction/binding of an analyte with/to a specific recognition element. The binding of an analyte in a sample to the recognition element will cause a change in the transistor characteristics such as a shift in threshold voltage (change in current) which can then be detected and, optionally, amplified, to obtain a readout indicating the presence of the analyte in the sample.

Figure 1A:
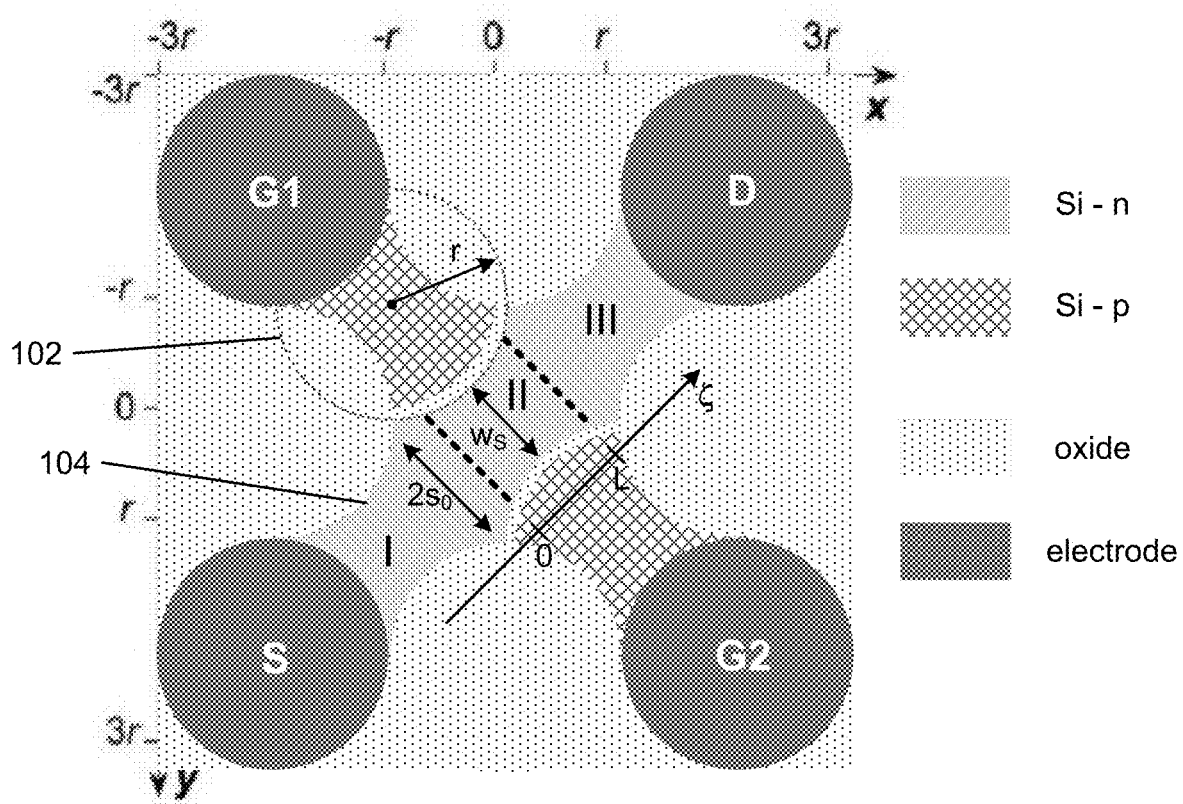
FIGS. 1A and 1B show a top view and a perspective view, respectively, of an example VeSFET embodiment.
Figure 1B:
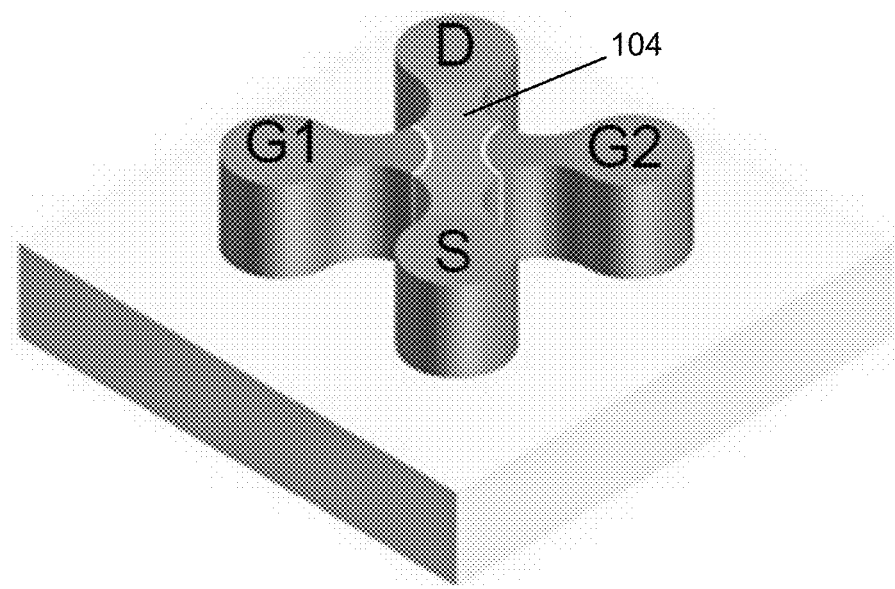
Figure 2A:
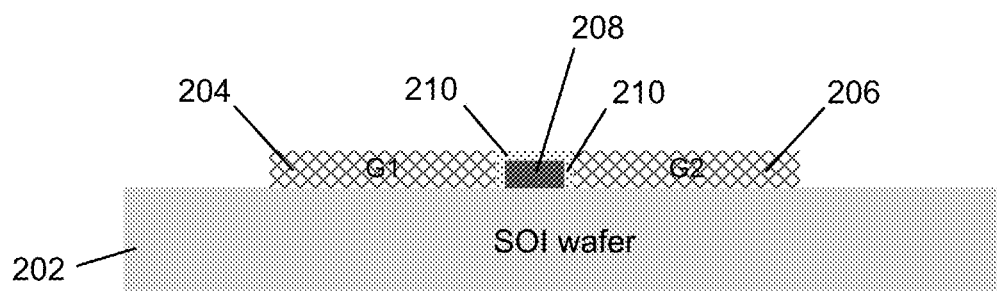
FIG. 2A illustrates a VeSFET device without chemical sensing capability.
Figure 2B:
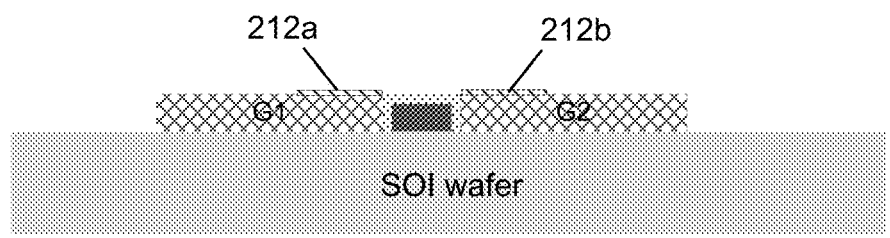
FIGS. 2B and 2C illustrate a chemically-sensitive VeSFET with a chemically-sensitive gate, according to the invention.
Figure 2C:
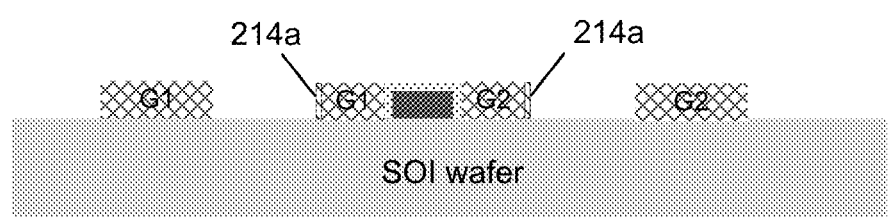
Figure 2D:
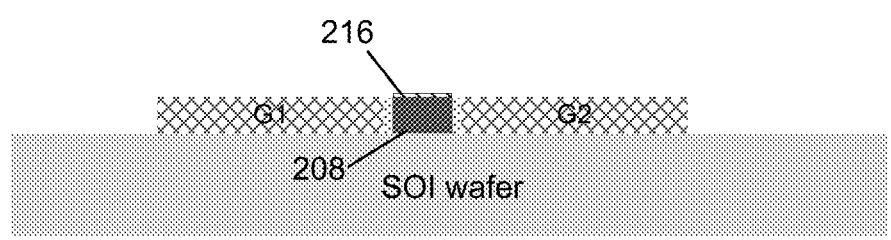
FIG. 2D illustrates a chemically-sensitive VeSFET with a chemically-sensitive channel, according to the invention.

A conventional VeSFET is depicted in FIGS. 1A and 1B. In the described embodiments, the site of the chemical recognition element (e.g., the electrode gate and/or channel surfaces) is functionalized in a manner rendering it suitable for attaching a recognition element to the gate or channel. The specific functionalization is selected according to the recognition element to be attached, so that the recognition element is attached to the channel or gate, yet remains capable of binding with the analyte of interest in a sample to be tested. Functionalization can be accomplished by any means known to those of skill in the art, but in particular, can be accomplished by silanes, such as 3-Aminopropyltriethoxysilane (APTES), or using carbodiimide chemistry to form peptide bonds between amines and carboxylic acid, or thiol linkages between a metal such as gold and the organic molecule. Chemical attachment can also be accomplished by any means known to those of skill in the art, and specifically, for example, the recognition element can be attached to the channel or gate by covalent attachment, but could also encompass electrostatic attachment.

Figure 3:
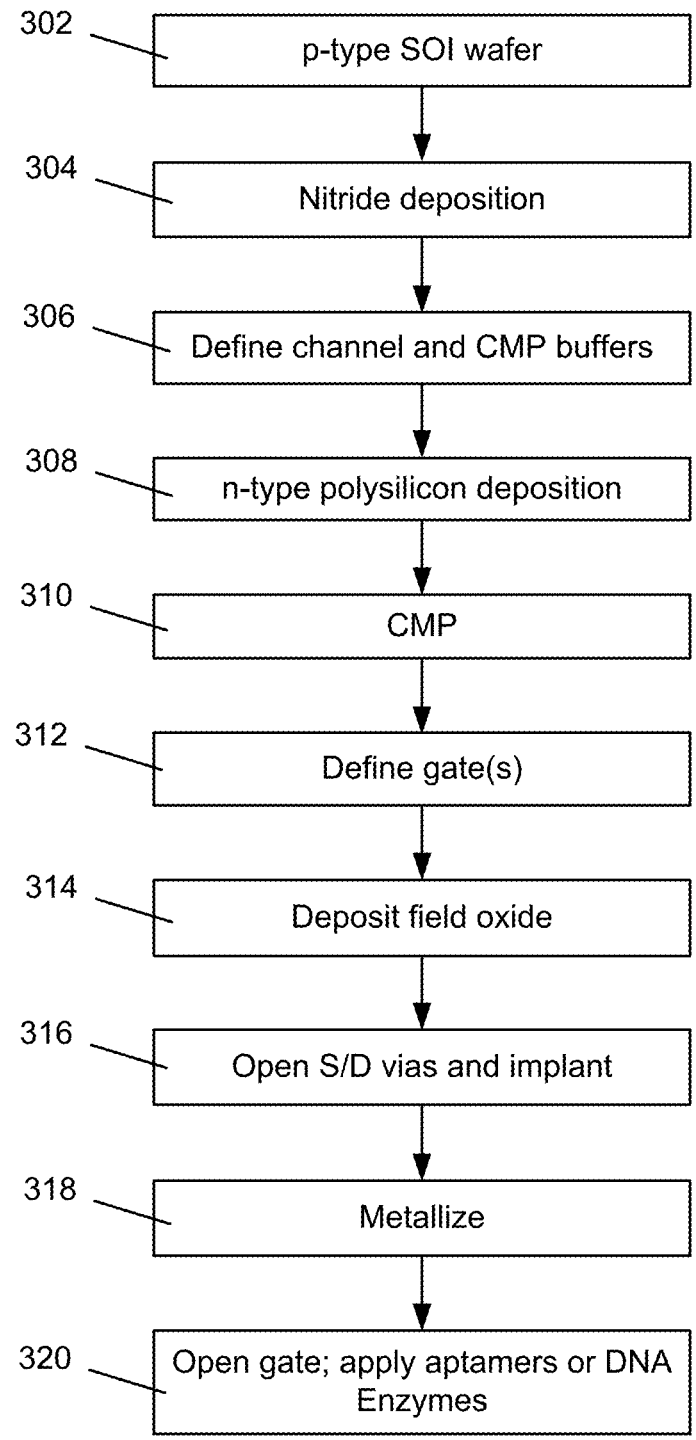
FIG. 3 describes the overall scheme of fabrication of a chemically-sensitive VeSFET, according to the invention.

The chemical VeSFET sensors of the described embodiments can be fabricated as described herein. In an example fabrication process, the following is accomplished:

Define the conductive channel
Grow gate oxide on the conductive channel
Grow a conductive polysilicon gate electrode
Define the gate electrode, leaving a gap at the channel
Deposit the field oxide
Implant source/drain (S/D) contacts
Deposit metal contacts
Deposit chemical recognition element FIG. 3 describes the overall scheme of fabrication of a p-channel device, comprising starting 302 with a p-type silicon-on-insulator (SOI) wafer, nitride deposition 304, defining 306 the D-S channel and chemical mechanical planarization (CMP), deposition 308 of n-type polysilicon, CMP polishing 310, definition of the gate(s) 312, deposition 314 of the field oxide, opening 316 of the source/drain (S/D)

vias and implant(s), metallization 318, and opening the gate(s) and application 320 of the chemical recognition element (e.g., aptamers or DNA Enzymes).

FIG. 4 through FIG. 16 describe an example fabrication process in detail for a p-channel device, which uses a p-type SOI and an n-type polysilicon. For an n-channel device, the process may use an n-type SOI and a p-type polysilicon. As described in the figures, silicon-on-insulator (SOI) technology is used to fabricate the sensor.

Figure 4:
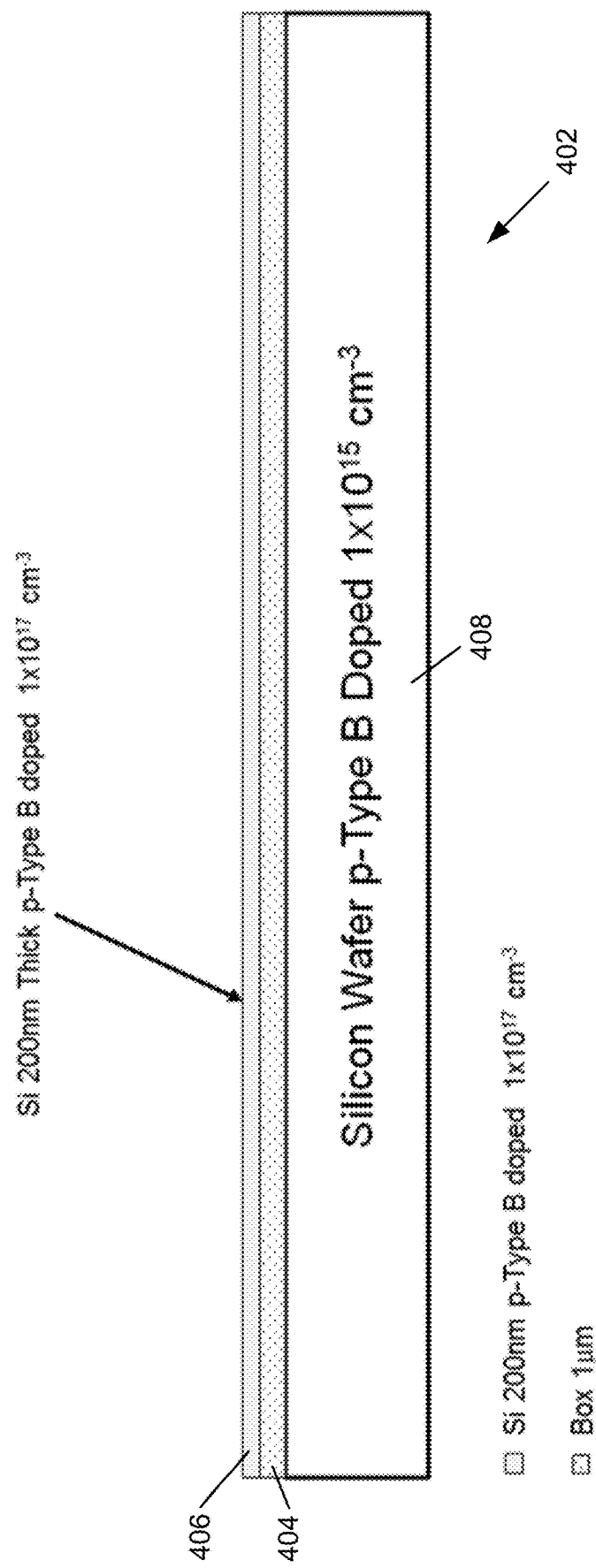
FIG. 4 through FIG. 15 describe an example fabrication process for a p-channel chemically-sensitive VeSFET, according to the invention.

FIG. 4 describes the starting wafer 402 comprising a silicon wafer support with an insulating layer 404 (referred to as "BOX" or "Box," which denotes buried oxide) with a thickness range of about between 100 nm and about 1000 nm thick, and a top layer 406 of doped silicon with a thickness range of between about 100 nm and about 500 nm. In general, the silicon doping can be n-type or p-type ($1\times10^{15}$ to $1\times10^{18}$ doping concentration), and in the example embodiment may specifically be p-type B doped $1\times10^{17}$ atoms per cm$^3$. The doping level of the substrate 408, below the BOX layers, is not important.

Figure 5:
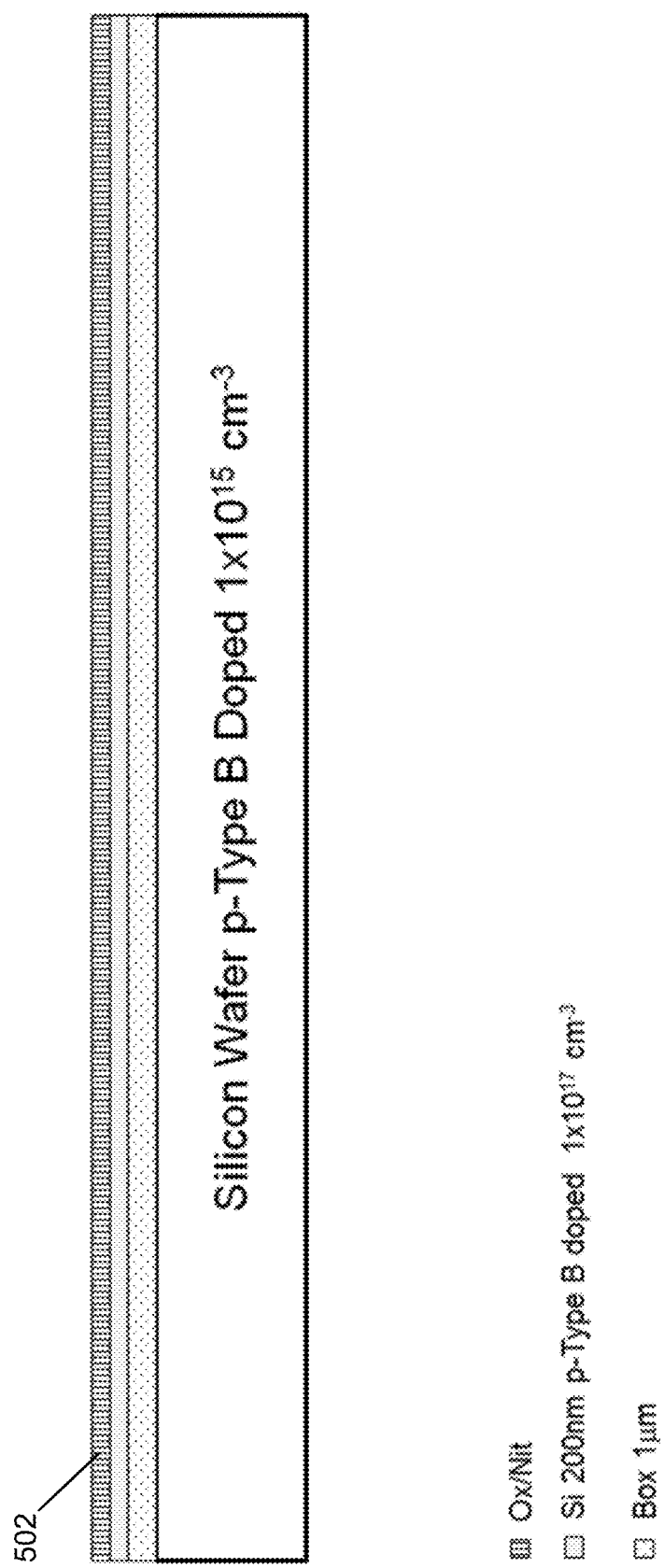

As shown in FIG. 5, the next step in fabrication is the growth, by thermal oxidation, of pad oxide (SiO$_2$ between about 5 nm and about 20 nm thick) and using low pressure chemical vapor deposition (LPCVD) to deposit a layer of silicon nitride Si$_3$N$_4$ (of about 50 nm to about 200 nm thick) to form a mask to define the channel (the pad oxide and silicon nitride are shown in FIG. 5 by reference number 502).

Figure 6:
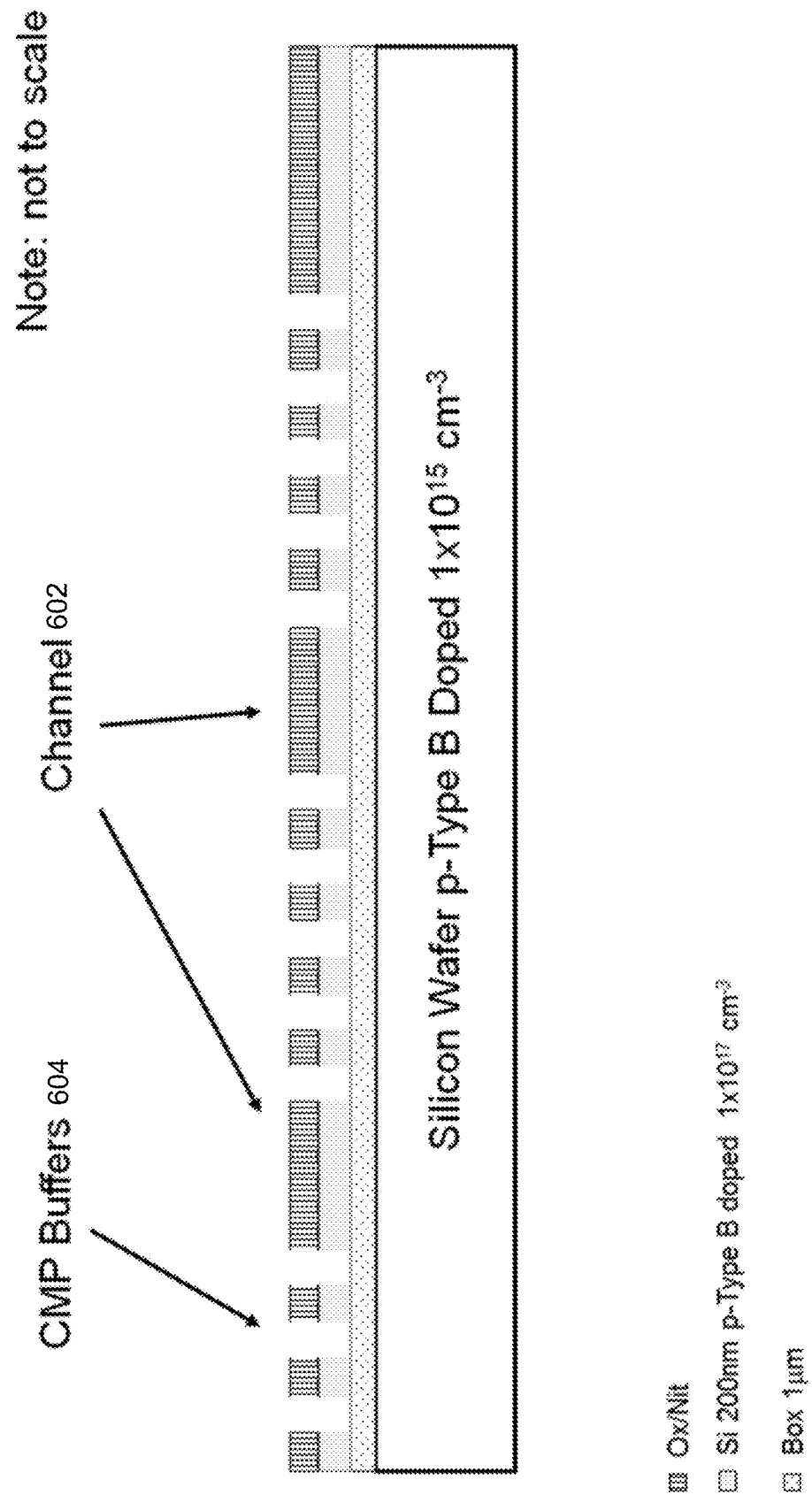

As shown in FIG. 6 photolithography is then used to create a photo stencil-plasma etch to remove the SiO$_2$/Si$_3$N$_4$, and a plasma etch may be used to remove the silicon, thus defining the channel 602 and CMP buffers 604. It is important to keep the sidewall of silicon straight, and to minimize etch of the buried oxide layer during this step.

Figure 7:
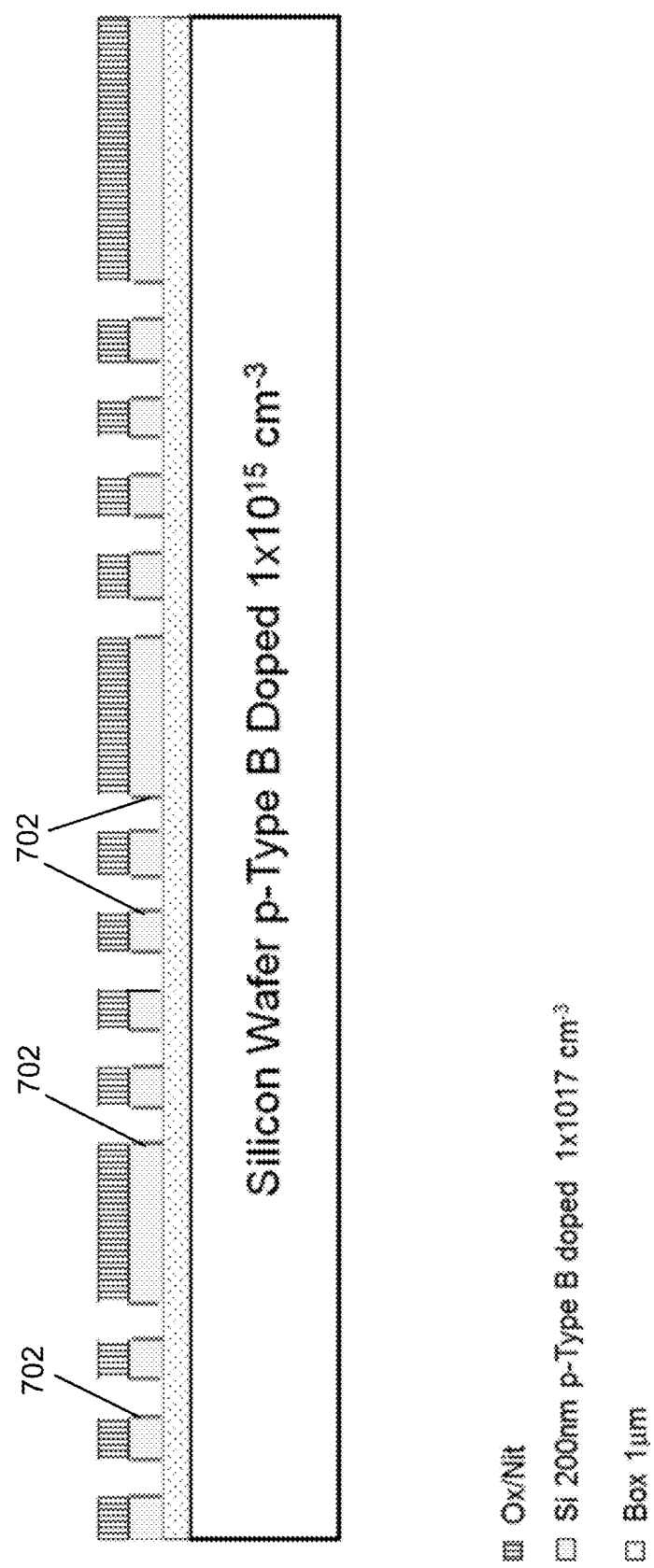

The next step, as depicted in FIG. 7, is sacrificial oxide and wet etch, followed by a growth of the gate oxide 702 by thermal oxidation to a thickness of about 4 nm to about 10 nm.

The oxide has different growth rates and surface roughness with regards to the <110> and <100> planes, so the process may be adjusted according to the particular plane orientation.

Figure 8:
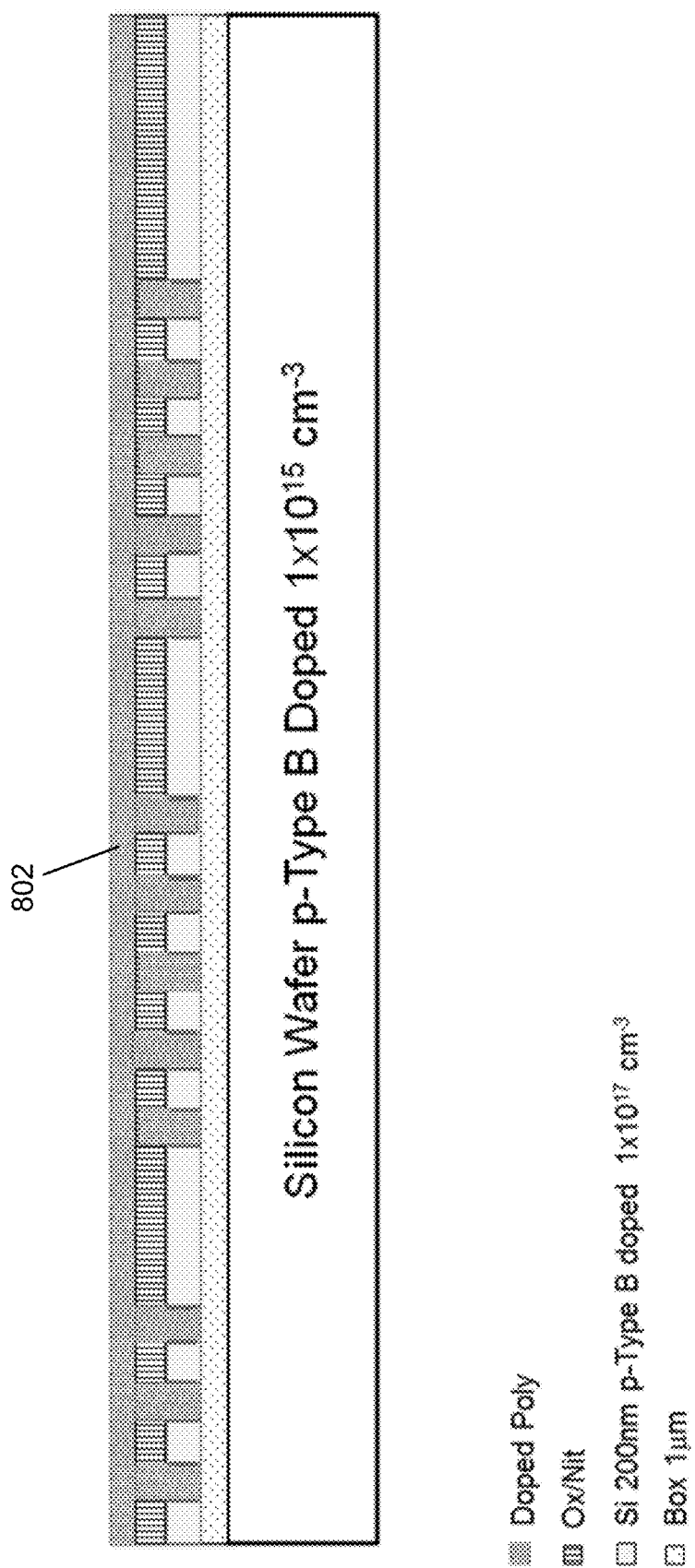

As shown in FIG. 8, conductive polysilicon gate electrodes 802 are then formed in-situ. An n-channel VeSFET requires in-situ boron doped polysilicon and a p-channel VeSFET requires in-situ PH$_3$ (phosphorous trihydride/phosphine) or As (arsenic) doped polysilicon. Concentration should be about $1\times10^{18}$ or about $1\times10^{19}$ atoms per cm$^3$, although this concentration may be adjusted to optimize the device performance.

Figure 9:
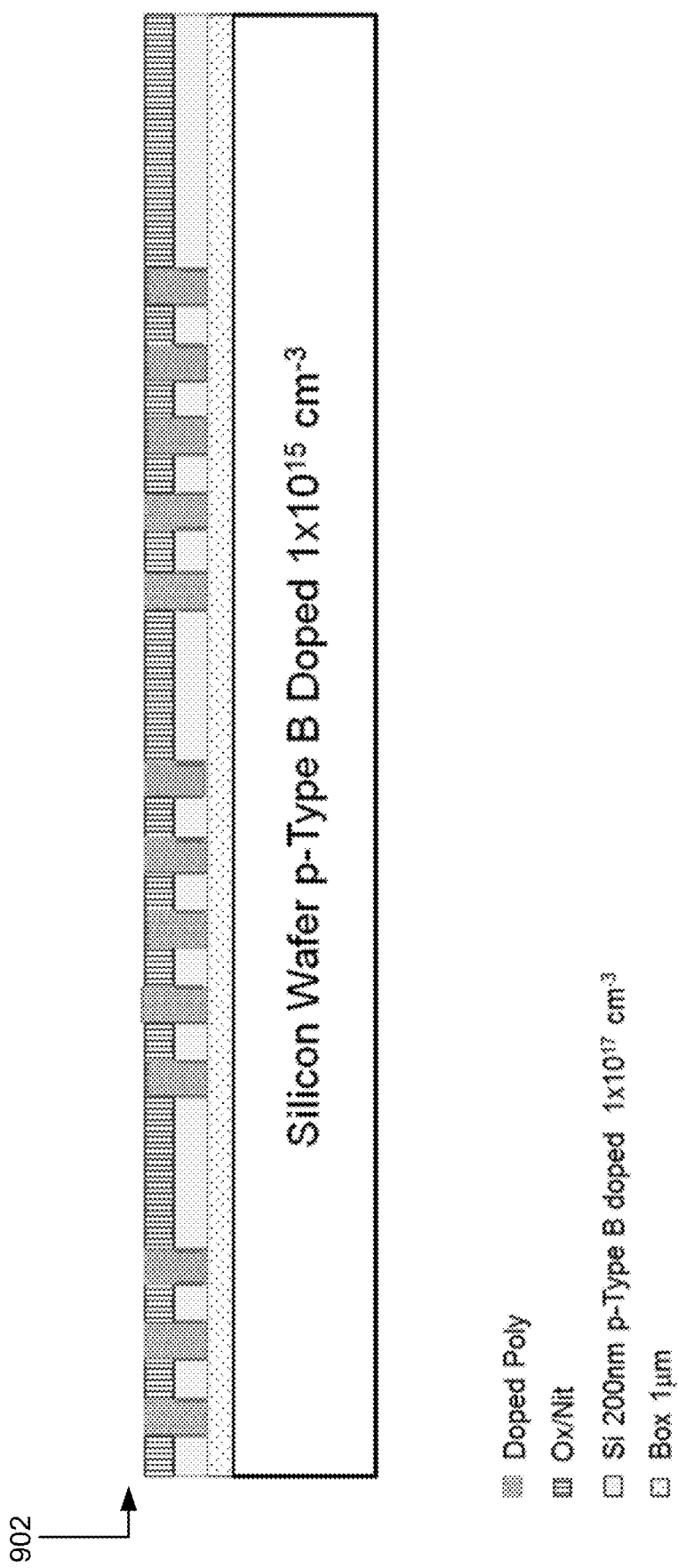

The next step, shown in FIG. 9, is a chemical mechanical planarization (CMP) stop 902 on the nitride layer to minimize the dishing of the polysilicon at the gate oxide interface. CMP is a polishing which utilizes a chemical slurry formulation and mechanical polishing process to remove unwanted conductive or dielectric materials on the silicon wafer. One of skill in the art can formulate the optimal CMP buffer to achieve the desired results. The CMP buffer design is crucial to the success of this process.

Figure 10:
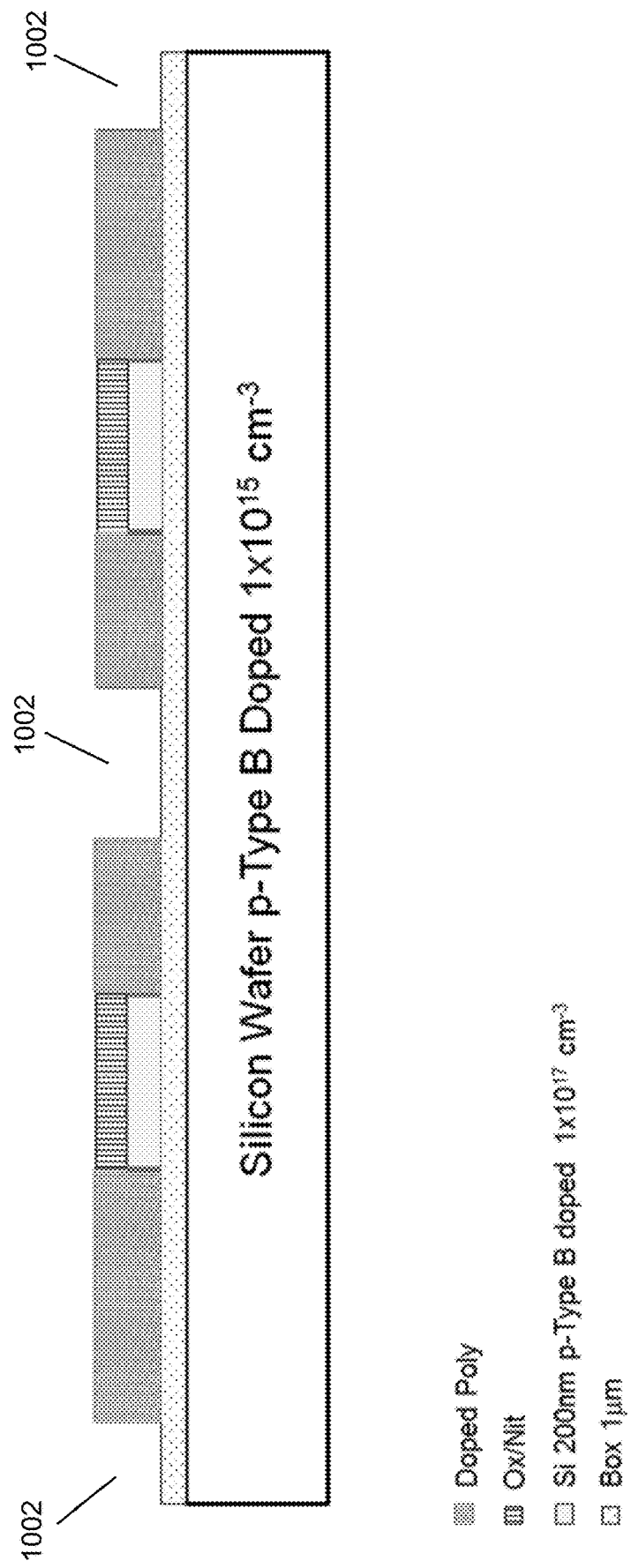

As shown in FIG. 10, photolithography and plasma etch may be used to define the gate region 1002 of the device. Photolithography is used to define the gate region, and a plasma etch of the polysilicon us used to create the gate.

Figure 11:
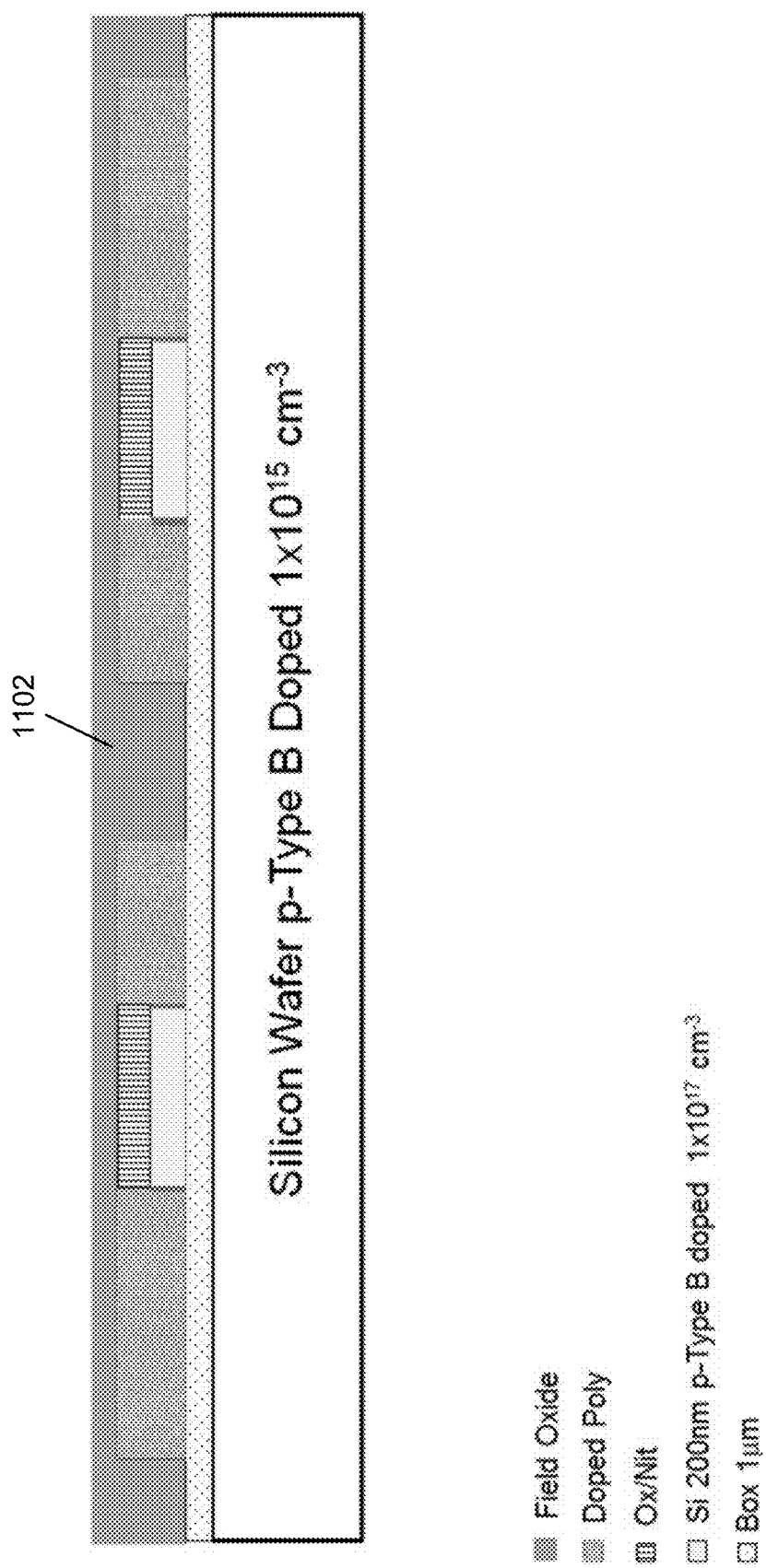
Figure 12:
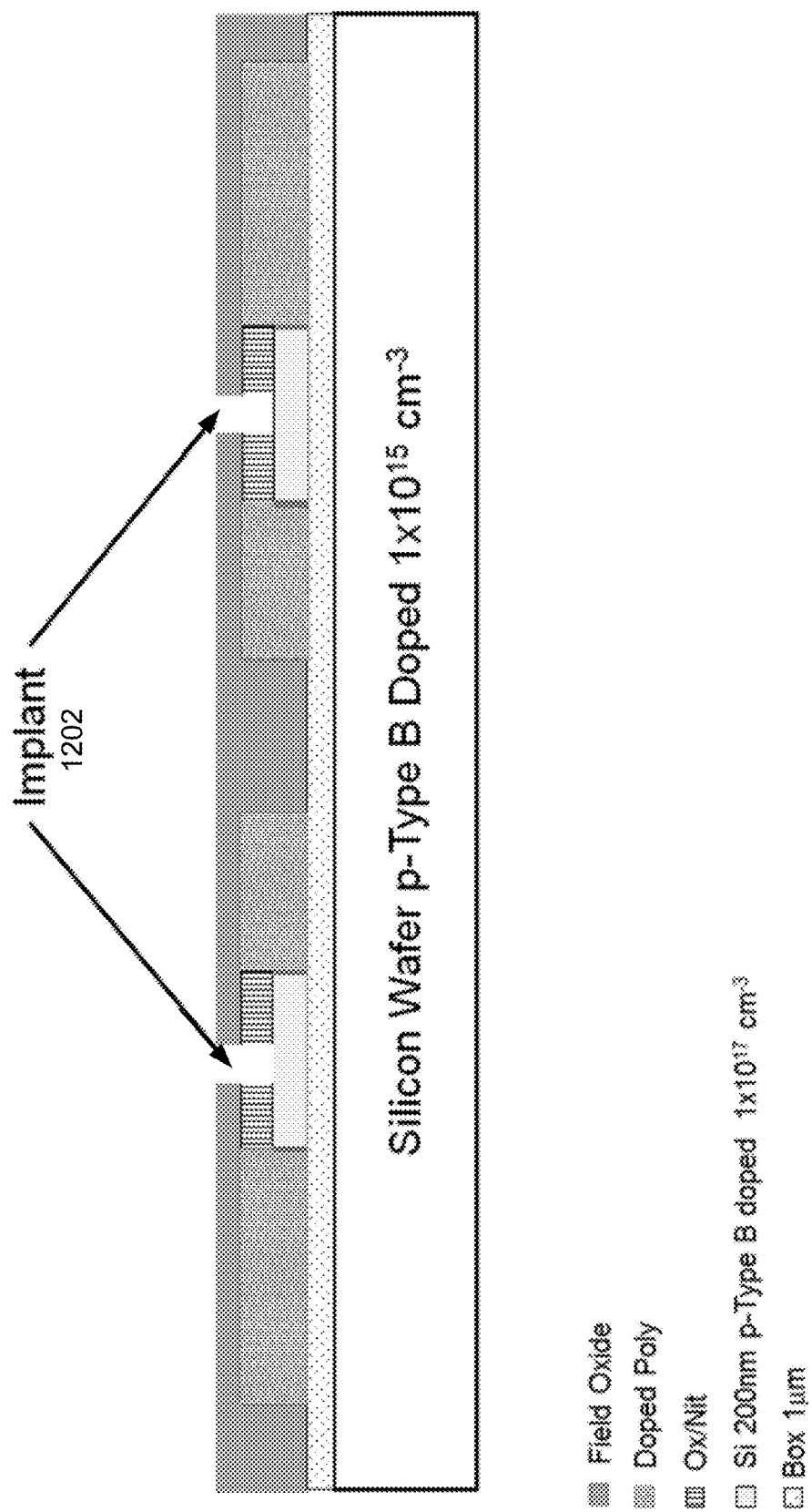

As shown in FIG. 11, chemical vapor deposition (CVD) of field oxide 1102 may be deposited with a thickness of about 300 nm to about 500 nm. As shown in FIG. 12, the source/drain (S/D) contact implants 1202 may be carried out. Photolithography may be used to define the S/D contact cuts using reactive ion etching (ME), and the gate may be created with a plasma etch (SiO$_2$/Si$_3$N$_4$/SiO$_2$). For a p-channel device implant p+ boron at greater than or equal to about $1\times10^{19}$ atoms per cm$^3$, and for an n-channel device implant PH$_3$ at great than or equal to about $1\times10^{19}$ atoms per cm$^3$.

Figure 13:
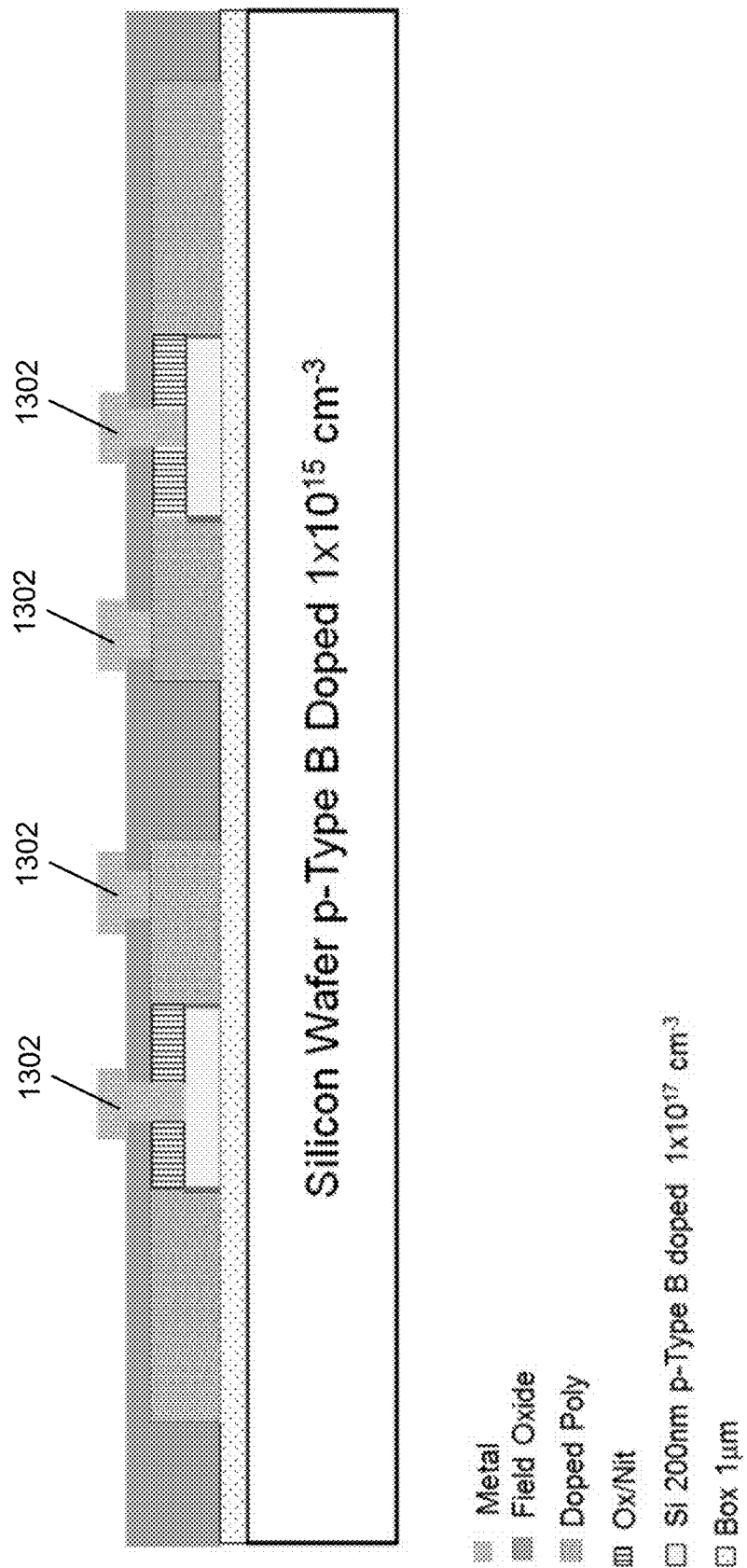

As shown in FIG. 13, metal contacts 1302 may then be deposited on the device with a nickel layer, then silicide by rapid thermal annealing (RTA). The nickel may then be removed by wet etch, and Al (aluminum) is deposited, annealed and photolithography is used to define and dry etch the metal.

Figure 14:
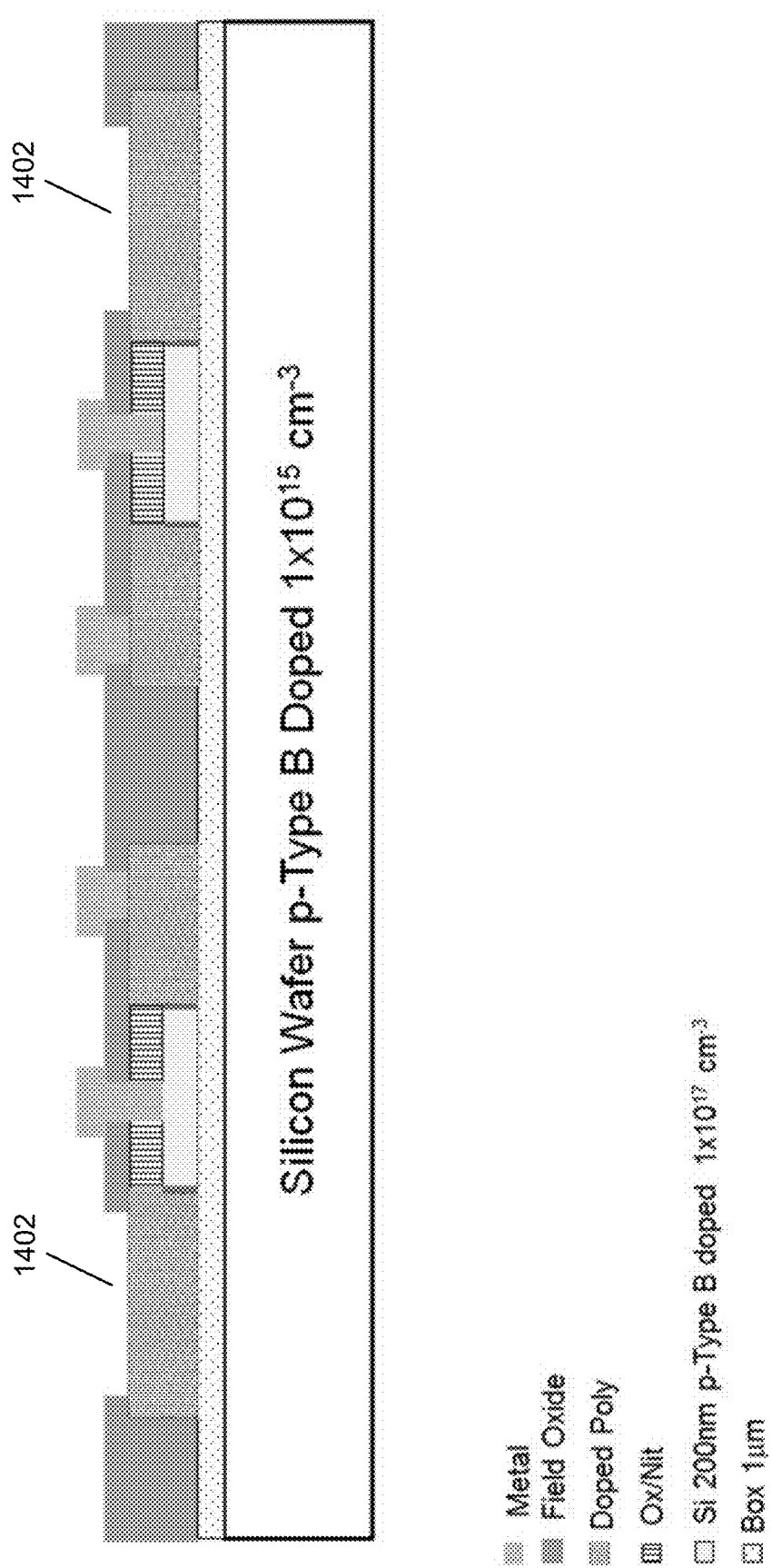

With the next step, depicted in FIG. 14, photolithography may be used to define the sensor oxide cut 1402, and a plasma etch may be used to cut the oxide.

Figure 15:
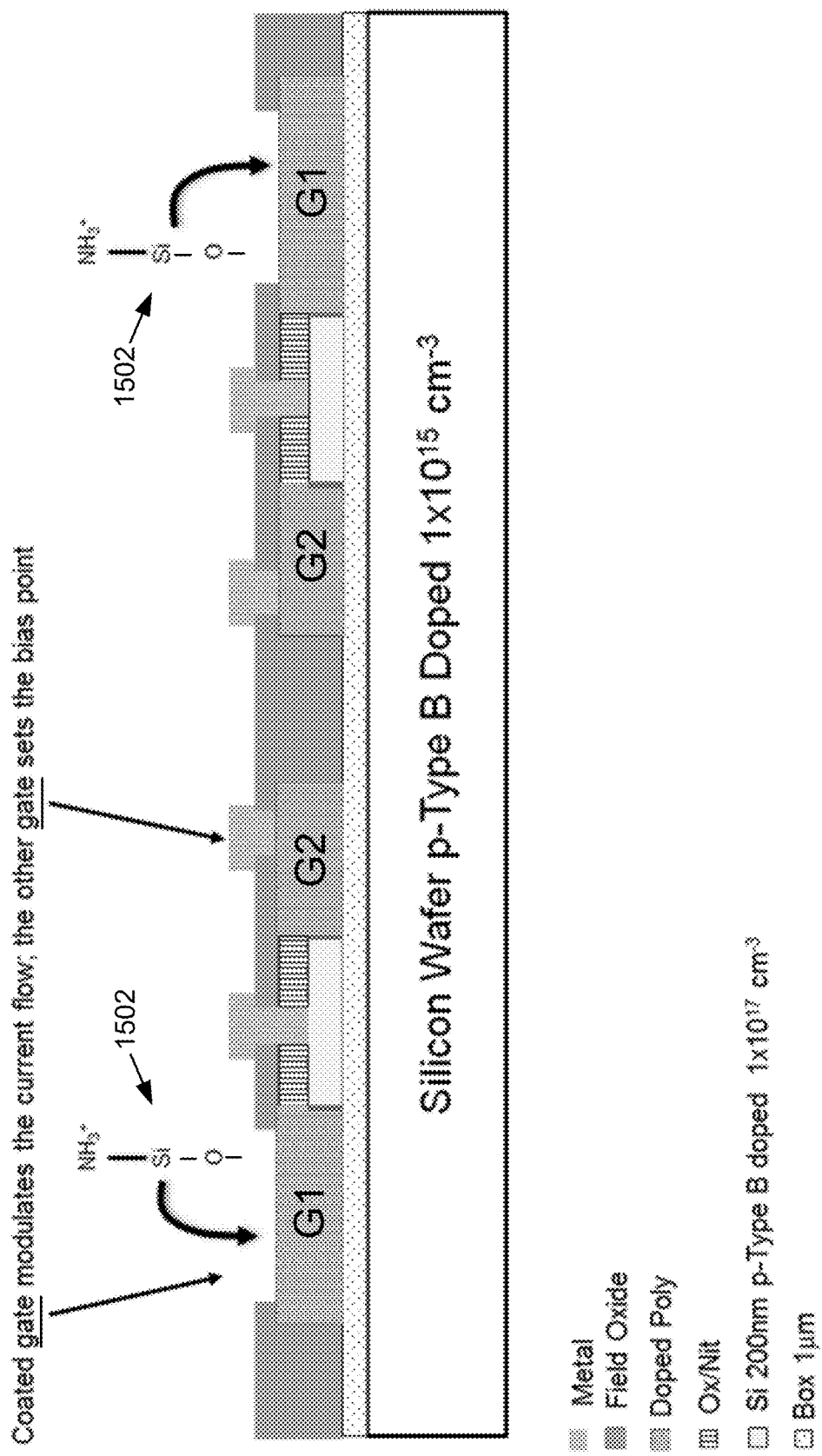

The final step in the fabrication process is to apply the chemical recognition element 1502 (a chemically-sensitive coating) to the gate structure, as shown in FIG. 15. In the example embodiment, one of the gates (G1) of each VeSFET has the chemical recognition element 1502 applied, although other embodiments may apply the chemical recognition element 1502 to both gates, to the channel, or combinations thereof (see, e.g., FIGS. 2A through 2D and the associated description).

The chemical recognition element 1502 in conjunction with gate G1 may modulate the current flow ($I_{DS}$) through the D-S channel, and the other gate G2 sets the bias point of the chemical sensor VeSFET when gate G1 and the associated chemical recognition element 1502 is exposed (contacted with) the chemical analyte of interest. As used herein, the term "modulates" refers to increasing or decreasing. Applying a coating on the VeSFET D-S channel may provide substantially the same $I_{DS}$ modulating effect as applying the coating on the VeSFET gate.

Figure 16:
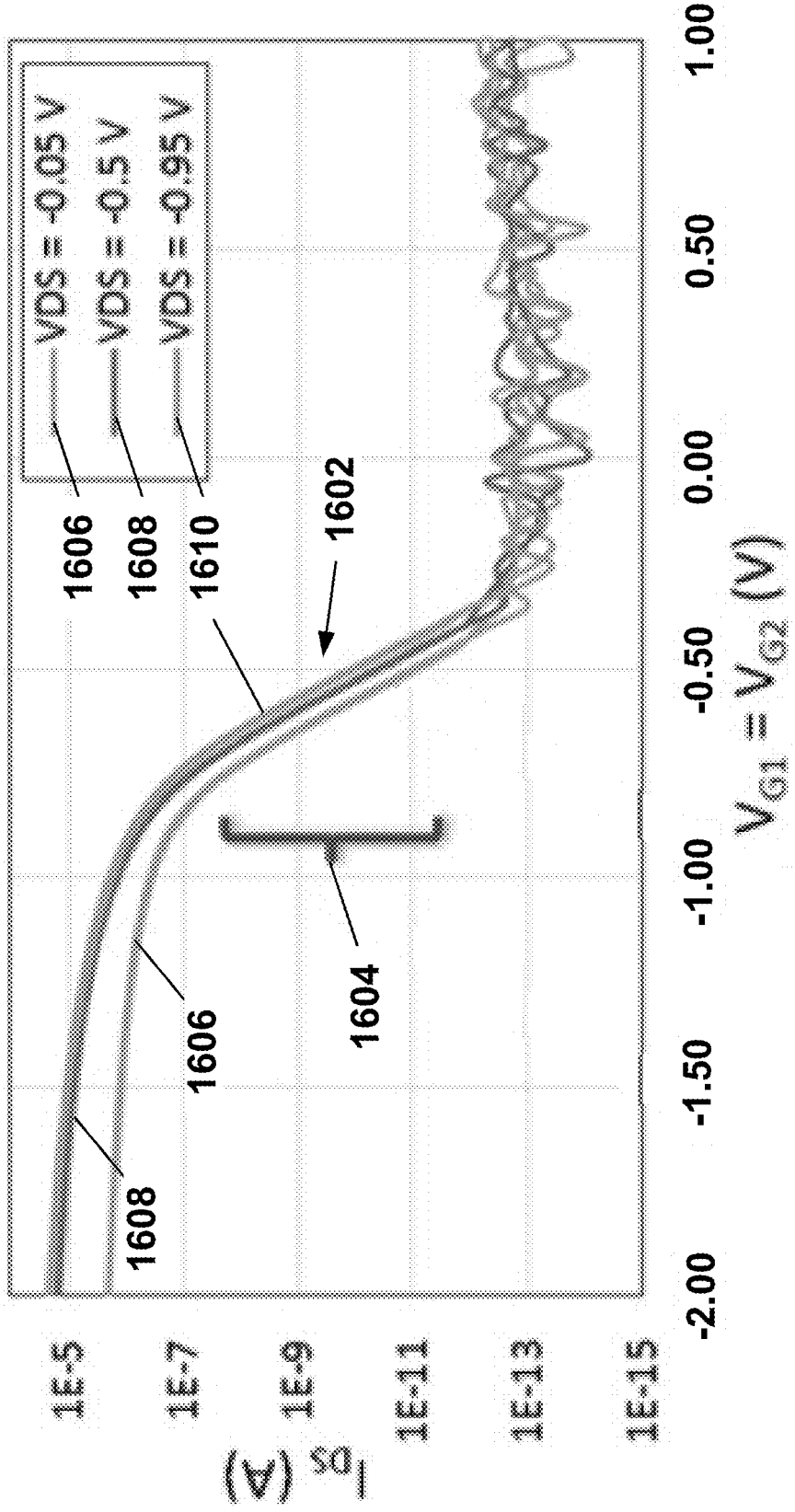
FIG. 16 describes characteristics of a chemically-sensitive VeSFET according to the invention.

Characteristics of a chemically-sensitive VeSFET suitable for use as a chemical sensor for the described embodiments are described in FIG. 16. One skilled in the art will understand that the example fabrication process described herein may be modified in various ways and still achieve the desired characteristics required for a chemical VeSFET of the described embodiments.

As depicted by FIG. 16, when the chemical VeSFET is biased with a D-S voltage and $V_{GS}$ is at zero volts, $I_{DS}$ will be at the "off" current of the VeSFET. When a voltage potential is applied to the bias gate, a small $I_{DS}$ current flows. The bias gate voltage is adjusted so that the $I_{DS}$ is in the subthreshold region 1602 of the $I_{DS}$ vs $V_{GS}$ slope (approximately 70 mV/decade in an example embodiment). As the sense gate charge is modified by the recognition element, the Ids increases or decreases within a region 1604 of the subthreshold slope, in which $I_{ds}$ exhibits a large change for a small change of $V_{GS}$. FIG. 16 shows three curves. Curve 1606 represents $I_{DS}$ vs $V_{GS}$ for $V_{DS}$ of −0.05 V, curve 1608 represents $I_{DS}$ vs $V_{GS}$ for $V_{DS}$ of −0.50 V, and curve 1610 represents $I_{DS}$ vs $V_{GS}$ for $V_{DS}$ of −0.95 V.

As described herein, a key feature of the chemical sensor VeSFET of the described embodiments is the chemical recognition element which is attached to the electrode gate and/or channel of the sensor, thereby sensitizing the VeSFET to a particular analyte. A modification of the local environment of the gate or channel will shift the band profile of the device, resulting in a change in channel current $I_{DS}$. More specifically, binding of the analyte of interest to the recognition element will result in a detectable signal, such as a change in the channel current $I_{DS}$.

The chemical recognition element may be any molecule capable of recognizing, binding, and/or interacting with an analyte of interest, with high affinity and specificity. Such recognition elements can include, for example, oligonucleotides, aptamers, peptides, proteins, antibodies and binding fragments thereof. The recognition element may also include larger protein antibodies that may recognize a specific antigen. By attaching a recognition element to the gate or the channel (or both), a change in $I_{DS}$ will result from the binding of the particular analyte.

A recognition element comprising peptides or oligonucleotides can be identified through techniques known to those of skill in the arts, for example by evolutionary display techniques or molecular library screening techniques. The characteristics of suitable recognition elements include the capability to attach to the gate, or channel, of the sensor either without modification or by suitable modification with a linker or functional chemical group and to retain its capability to specifically recognize and/or bind to the analyte of interest.

If the analyte of interest is a larger molecule such as a protein antigen, and the recognition element is an antibody or antibody fragment, it may be desirable to amplify the detectable signal. Amplification can be accomplished using an Enzyme-Linked Immunosorbent Assay (ELISA) type approach. First, the analyte of interest attaches to the gate or channel. Next, secondary antibody, which is also capable of binding to the analyte of interest, binds to the analyte already bound to the recognition element attached to the gate or channel. The secondary antibody carries a nanoparticle or other chemical group that will significantly alter the local band structure. The secondary antibody (with the nanoparticle or other chemical group) being bound to the analyte already bound to the recognition element attached to the gate or channel causes an amplification of the signal, thereby increasing sensitivity. Increased sensitivity can also be achieved by the use of a dual gate feature where one gate acts as the "sense" gate and the other gate acts as the "control" gate, thus controlling for background noise and increasing the sensitivity of the recognition event.

The dual gate of the VeSFET of the described embodiments is particularly valuable for improving signal detection with the described chemical sensor. The signal from a binding event can be quite weak and the VeSFET device may be susceptible to non-specific background signals. The ability to separately address a "sense" gate and a "control" gate may be used to correct for such susceptibility.

In one embodiment, the recognition element is a DNAzyme. DNAzymes can be evolved to recognize a specific analyte of interest and respond to the analyte by cutting a single strand of DNA. Although DNAzymes typically recognize metals (e.g., U, Pu) they can also be designed to recognize small molecules and there is some progress in the recognition of proteins, peptides and carbohydrates (Hollenstein, M., Molecules 2016, 20, 20777-20804).

If a label is attached to the DNA strand, when the DNA is cut, a signal can be generated. The signal can be the release of a quencher molecule to elicit a fluorescence signal, or the release of an electrochemically active molecule such as $(Ru(bpy)_3)$ leading to a change in the voltammetric behavior ("Electrochemical DNAzyme Sensor for Lead Based on Amplification of DNA-Au Bio-Bar Codes," Analytical Chem. 2008, 80(16) pp. 6323-6332). The chemical sensor of the described embodiments may be used to efficiently read an electrochemical response from a DNAzyme.

Further encompassed by the present embodiments is a category of DNAzymes where the "leaving" group is strongly electron donating or electron withdrawing. Such suitable leaving groups are small inorganic nanoparticles, organometallic groups, organic semiconductors such as anthracene and pentacene, or individual organic groups such as nitriles and phenols. DNAzymes are particularly useful for the chemical sensors described herein as they are catalytic and a single analyte can stimulate multiple "cut" events, thereby amplifying the detectable signal. This approach has an advantage over the aptamer approach, because the signal, even for a single cleavage event, will likely be larger than a simple binding event. The signal is thus governed by the leaving group, rather than the analyte itself, providing more uniform chemical VeSFET signals for a range of analytes.

Figure 17A:
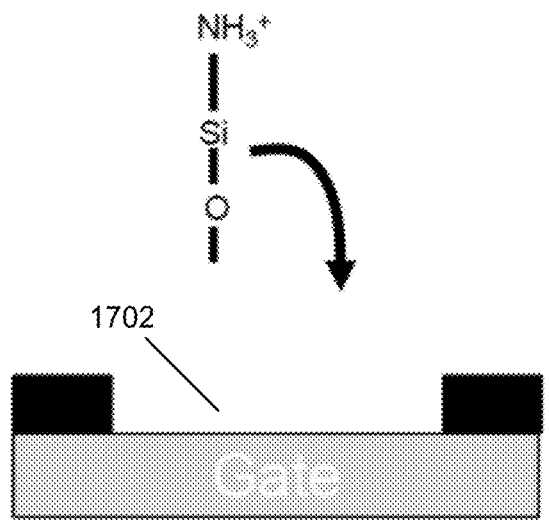
FIGS. 17A, 17B and 17C depict an example technique for recognition element attachment to a chemically-sensitive VeSFET, according to the invention.
Figure 17B:
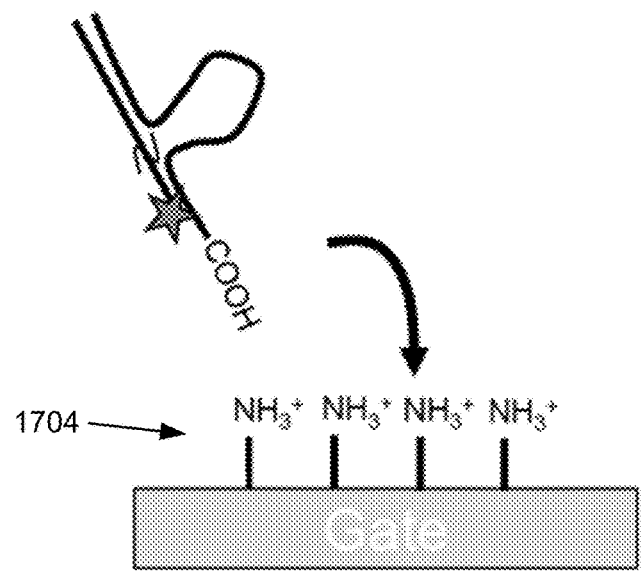
Figure 17C:
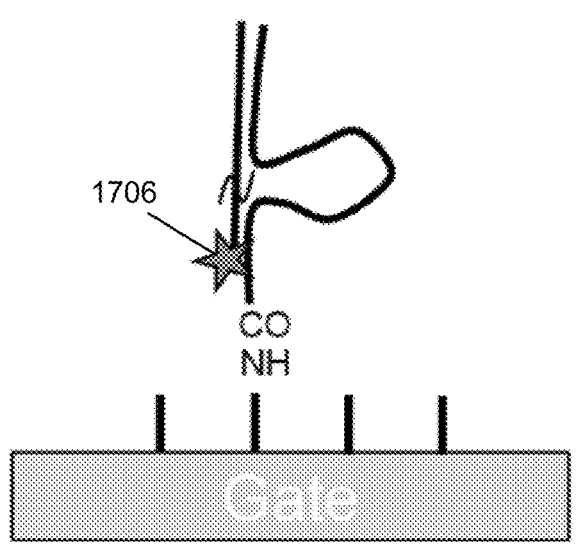

For recognition element attachment, the VeSFET is lithographically patterned with resist to open only the areas 1702 upon which the recognition elements are to be attached, as shown in FIG. 17A. The gate (and/or channel surface) will be functionalized with silanes 1704 (APTES for example) or other appropriate molecules that provide groups for coupling to the recognition element, as shown in FIG. 17B. The leaving group 1706 is represented by the star shaped symbol. The DNAzyme can then be coupled to the surface with an appropriate linkage chemistry, for example using carbodiimide chemistry to form peptide bonds between amines and carboxylic acids, as shown in FIG. 17C.

In another embodiment, the chemical recognition element may be an enzyme, such as glucose oxidase or peroxidase that catalytically produces ions or electrons in response to the substrate molecule. In a particular embodiment, the enzyme may be attached and/or immobilized on only one of the two gates and a local change in current can be detected. A challenge with current enzyme/FET technologies is that they require careful control of local pH, ionic strength and other background factors, to avoid interference from these factors. Because of the dual gate feature of the VeSFET of the described embodiments, one gate may be used to control for background effects, while the other gate may be used to provide the signal response from the enzyme.

An embodiment may comprise an array of VeSFET chemical sensors fabricated on a single chip. The example process flow depicted by FIGS. 4-15 depicts two VeSFET chemical sensors being fabricated on a single substrate, although an array may comprise more than two such VeSFETs. An array of sensors may comprise multiples of an identical sensor sensitized to detect the same analyte in a single sample and thereby to enhance signal detection. Alternatively, the array may comprise multiple, distinct sensors or sensor groups (each sensitized to a particular analyte) to detect a number of different analytes in a single sample.

In one aspect, the invention may be a chemical sensor instrument that produces information related to a sample introduced to the chemical sensor instrument for the presence of an analyte for which the chemical sensor has been sensitized. In general, the chemical instrument comprises a sensing component, which is capable of producing a discernable phenomenon that varies in response to contact with a particular analyte. In an example embodiment, a chemical sensor instrument may comprise a chemical sensing VeSFET as described herein (or an array of such VeSFETs), and an amplifier component configured to enhance the variable phenomenon (in this example, the magnitude of $I_{DS}$ in the VeSFET channel) to a level that is suitably observable and interpretable.

Figure 18:
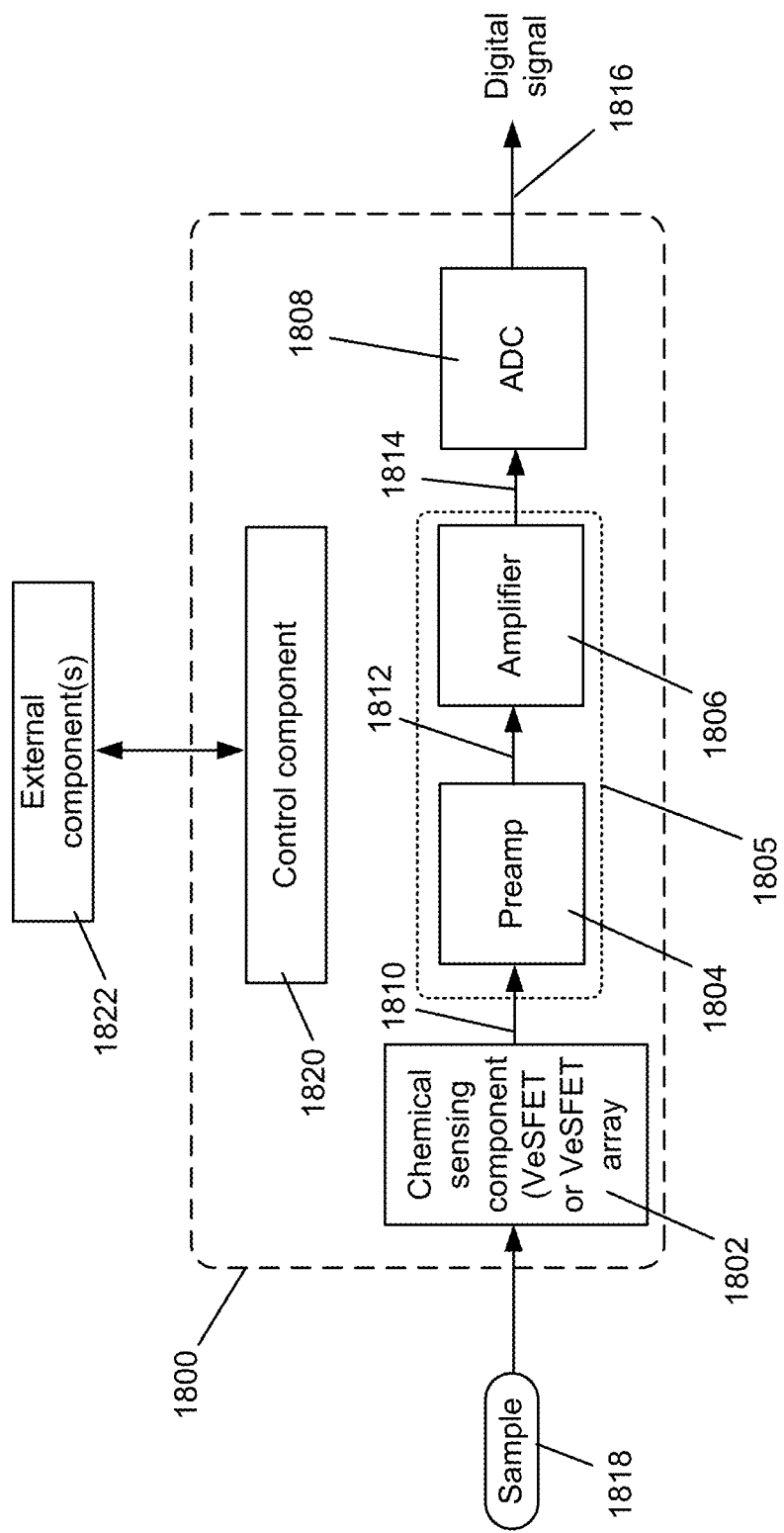
FIG. 18 shows an example embodiment of a chemical sensor instrument, according to the invention.

FIG. 18 shows another example embodiment of a chemical sensor instrument 1800, comprising a chemical sensing component 1802, a preamplifier 1804, a primary amplifier

1806, and an analog-to-digital converter (ADC) 1808. The preamplifier 1804 and the amplifier 1806 may be considered as an amplifier component 1805. The chemical sensing component 1802 may comprise a chemical sensor VeSFET sensitized to a particular analyte by attaching a corresponding chemical recognition element to the VeSFET. Alternatively, the chemical sensing component 1802 may comprise an array of chemical sensor VeSFETs, each of which has been sensitized to a particular analyte by attaching a corresponding chemical recognition element to the VeSFET. The array may comprise groups of chemical sensor VeSFETs, each group sensitized to a particular analyte as described herein, and each group sensitized to detect an analyte that is different from the other VeSFET groups.

The preamplifier 1804 may have a high input impedance, a low output impedance, and a substantially constant gain, to amplify the small signal levels produced by the VeSFET(s) of the chemical sensing component 1802 without significantly degrading the signal-to-noise ratio (SNR). The preamplifier 1824 amplifies the sense signal(s) 1810 from the chemical sensor component 1802 and provides the amplified signal 1812 to the primary amplifier 1806.

The primary amplifier 1806 further amplifies the amplified signal 1812 received from the preamplifier 1804, and provides the further amplified signal 1814 to the ADC 1808. The ADC 1808 generates a digital signal 1816 corresponding to the further amplified signal 1814. The chemical sensor instrument 1800 thus produces the digital signal 1816 that is derived from a sample 1818 applied to the chemical sensor instrument, and ultimately to the chemical sensor component 1802. Modulation of the digital signal may occur if the sample 1818 contains an analyte to which the chemical sensor component 1802 is sensitized.

The chemical sensor component may further comprise a control component 1820, which may be connected (not shown, for legibility) to one or more of the chemical sensor component 1802, the preamplifier 1804, the amplifier 1806 and the ADC 1814. The control component 1820 may receive supervisory information from external component(s) 1822 necessary to initiate and provide control parameters (such as bias voltages, amplifier gain, among others) for the other components of the chemical sensor instrument 1800.

The control component 1820 may comprise a processing system with a processor, memory and other ancillary components necessary to generate the various parameters and control signals for the other components of the chemical sensor instrument 1800.

The control component 1820 may further comprise a detection system that receives and evaluates the digital signal 1816 to determine if the sample applied to the chemical sensor instrument 1800 contains a particular analyte of interest. The detection system may measure the modulation of the digital signal 1816 and compare the measured modulation against a predetermined threshold, traversing which may indicate the presence of an analyte. The detection system may adjust the predetermined threshold according to information received from the external components 1822, according to information received from other components of the chemical sensor instrument 1800, or both. In other embodiments, the detection system may be located external to the chemical sensor instrument 1800.

Figure 19:
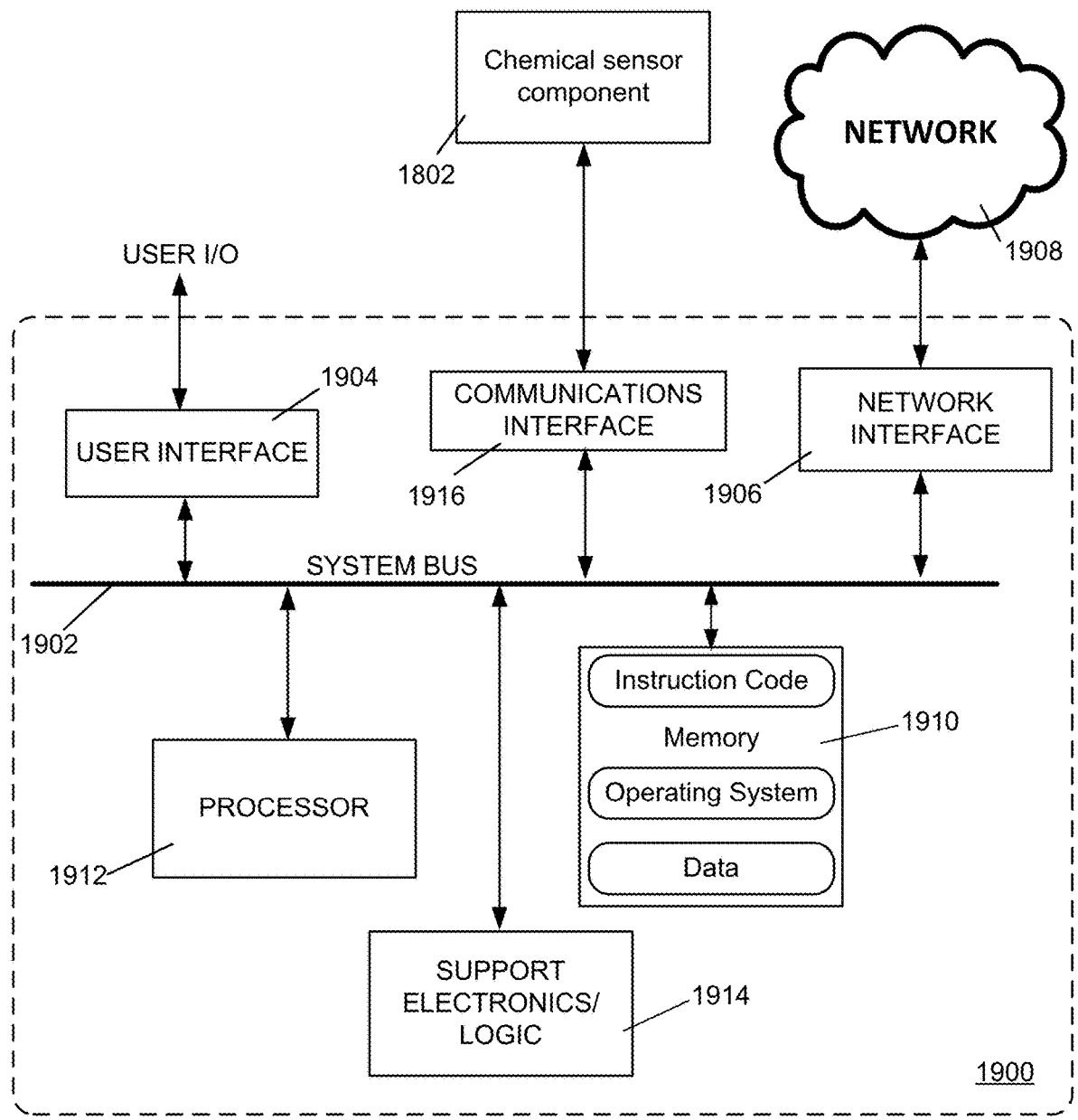
FIG. 19 is a diagram of an example internal structure of a processing system that may be used to implement one or more of the embodiments described herein.

FIG. 19 is a diagram of an example internal structure of a processing system 1900 that may be used to implement one or more of the embodiments herein. Each processing system 1900 contains a system bus 1902, where a bus is a set of hardware lines used for data transfer among the components of a computer or processing system. The system bus 1902 is essentially a shared conduit that connects different components of a processing system (e.g., processor, disk storage, memory, input/output ports, network ports, etc.) that enables the transfer of information between the components.

Attached to the system bus 1902 is a user I/O device interface 1904 for connecting various input and output devices (e.g., keyboard, mouse, displays, printers, speakers, etc.) to the processing system 1900. A network interface 1906 allows the computer to connect to various other devices attached to a network 1908. Memory 1910 provides volatile and non-volatile storage for information such as computer software instructions used to implement one or more of the embodiments described herein, for data generated internally and for data received from sources external to the processing system 1900.

A central processor unit 1912 is also attached to the system bus 1902 and provides for the execution of computer instructions stored in memory 1910. The system may also include support electronics/logic 1914, and a communications interface 1916. The communications interface may communicate with one or more of the other components of the chemical sensor instrument 1900. In the example embodiment of FIG. 19, the communications interface 1916 is shown coupled to the chemical sensor component 1802 described with reference to FIG. 18, although it should be understood that the communications interface 1916 may communicate with the other components of the chemical sensor instrument 1800 and/or components external to the chemical sensor instrument 1800.

In one embodiment, the information stored in memory 1910 may comprise a computer program product, such that the memory 1910 may comprise a non-transitory computer-readable medium (e.g., a removable storage medium such as one or more DVD-ROM's, CD-ROM's, diskettes, tapes, etc.) that provides at least a portion of the software instructions for the invention system. The computer program product can be installed by any suitable software installation procedure, as is well known in the art. In another embodiment, at least a portion of the software instructions may also be downloaded over a cable communication and/or wireless connection.

Figure 20:
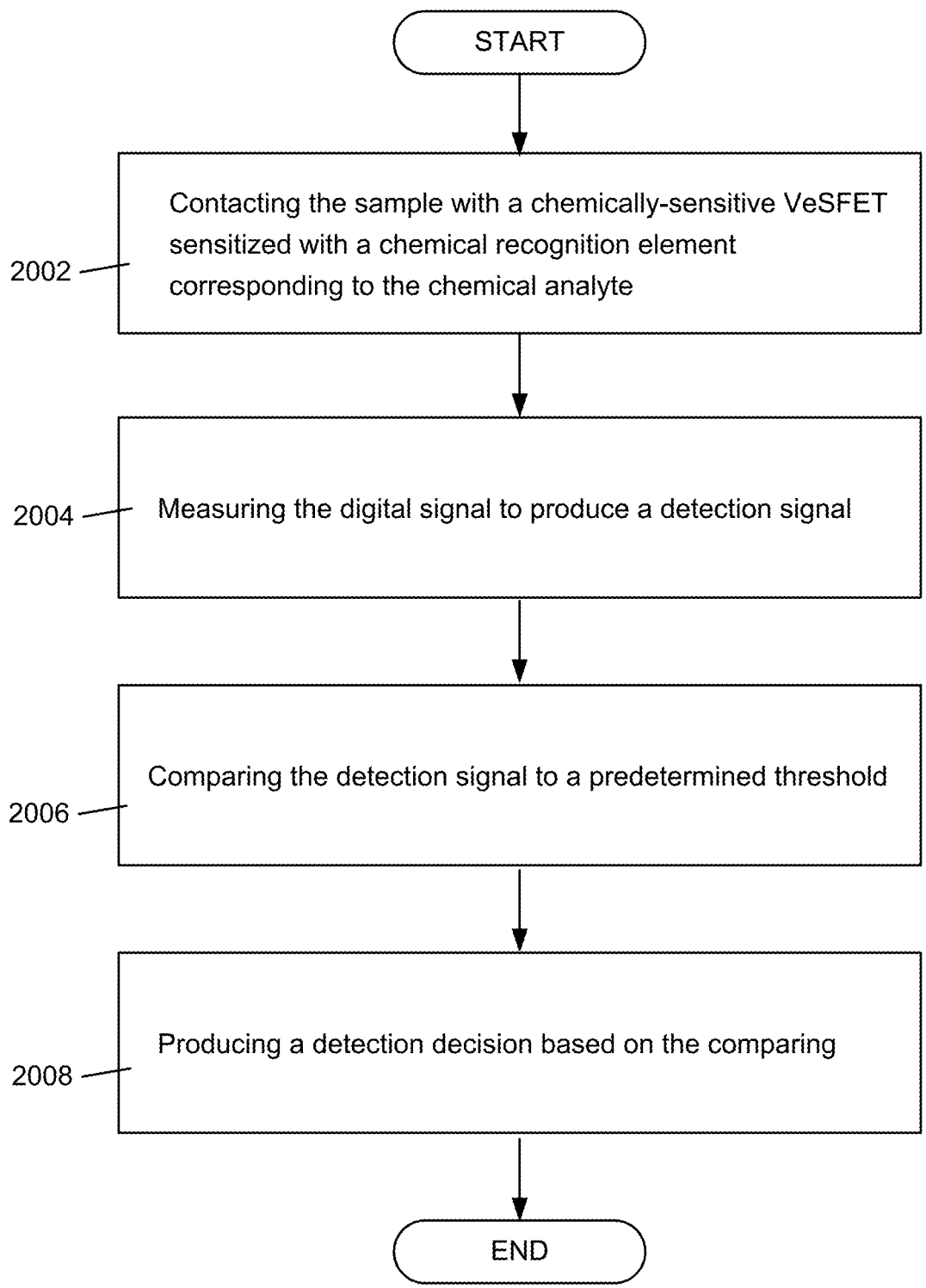
FIG. 20 illustrates an example method of detecting a chemical analyte of interest in a sample.

FIG. 20 illustrates an example method of detecting a chemical analyte of interest in a sample. The method may comprise contacting 2002 the sample with a chemically-sensitive VeSFET sensitized with a chemical recognition element corresponding to the chemical analyte. The method may further comprise measuring 2004 the digital signal to produce a detection signal, comparing 2006 the detection signal to a predetermined threshold, and producing 2008 a detection decision based on the comparing.

It will be apparent that one or more embodiments described herein may be implemented in many different forms of software and hardware. Software code and/or specialized hardware used to implement embodiments described herein is not limiting of the embodiments of the invention described herein. Thus, the operation and behavior of embodiments are described without reference to specific software code and/or specialized hardware—it being understood that one would be able to design software and/or hardware to implement the embodiments based on the description herein.

Further, certain embodiments of the example embodiments described herein may be implemented as logic that performs one or more functions. This logic may be hardware-based, software-based, or a combination of hardware-based and software-based. Some or all of the logic may be stored on one or more tangible, non-transitory, computer-readable storage media and may include computer-executable instructions that may be executed by a controller or processor. The computer-executable instructions may include instructions that implement one or more embodiments of the invention. The tangible, non-transitory, computer-readable storage media may be volatile or non-volatile and may include, for example, flash memories, dynamic memories, removable disks, and non-removable disks.

While example embodiments have been particularly shown and described, it will be understood by those skilled in the art that various changes in form and details may be made therein without departing from the scope of the embodiments encompassed by the appended claims.

What is claimed is:

1. A chemical sensing instrument, comprising:
a chemically-sensitive vertical slit field effect transistor (VeSFET) formed on a silicon-on insulator (SOI) substrate,
a chemical recognition element attached to at least one of (i) a first gate structure of the VeSFET, (ii) a second gate structure of the VeSFET, and (iii) a channel of the VeSFET, the recognition element being capable of binding to a chemical of interest such that the binding of the chemical to the recognition element results in a modification of current flow of the VeSFET resulting in a detectable signal;
an amplifier configured to receive the detectable signal and produce an amplified signal; and
an analog-to-digital converter (ADC) configured to receive the amplified signal and to produce a digital signal that represents the amplified signal.

2. The instrument of claim 1, further comprising one or more additional chemically-sensitive VeSFETs formed on the silicon-on insulator (SOI) substrate to form a chemical sensor array.

3. The instrument of claim 2, wherein at least one of the one or more additional VeSFETs comprises an alternative chemical recognition element that is different from the chemical recognition element.

4. The instrument of claim 1, further comprising a detection system configured to measure the digital signal to produce a detection signal, compare the detection signal to a predetermined threshold, and produce a detection decision based on the comparison.

5. The instrument of claim 4, wherein the digital signal is characterized by a modulation, and the detection system is configured to measure the modulation against the predetermined threshold, traversing which produces the detection decision that indicates presence of a corresponding analyte.

6. The instrument of claim 1, further comprising a control component configured to one or both of (i) receive supervisory information from one or more external components, and (ii) distribute control and parametric information to at least one of the chemically-sensitive VeSFET, the amplifier and the ADC.

7. The instrument of claim 1, wherein the amplifier comprises a series-coupled preamplifier and a primary amplifier, the preamplifier configured to receive a first signal from the chemically-sensitive VeSFET, and provide a second signal to the primary amplifier.

8. The instrument of claim 1 wherein the VeSFET has dual electrode gates.

9. The instrument of claim 1 wherein the VeSFET is an n-channel VeSFET, and the n-channel VeSFET has at least one gate with a p-type gate electrode.

10. The instrument of claim 1 wherein the VeSFET is a p-channel VeSFET, and the p-channel VeSFET has at least one gate with an n-type gate electrode.

11. The instrument of claim 1, wherein the recognition element is selected from the group consisting of: a protein, peptide, an antibody, or binding fragment thereof, an oligonucleotide, an aptamer, and enzyme and a DNAzyme.

12. A chemical sensor device, comprising:
an array of one or more chemically-sensitive vertical slit field effect transistors (VeSFETs) formed on a silicon-on-insulator (SOI) wafer substrate;
for each VeSFET of the array:
a chemical recognition element attached to at least one of (i) a first gate structure of the VeSFET, (ii) a second gate structure of the VeSFET, and (iii) a channel of the VeSFET, the recognition element being capable of binding to a chemical of interest such that the binding of the chemical to the recognition element results in a modification of current flow of the VeSFET resulting in a detectable signal.

13. The chemical sensor device of claim 12, further comprising:
an amplifier configured to receive the detectable signal and produce an amplified signal;
an analog-to-digital converter (ADC) configured to receive the amplified signal and to produce a digital signal that represents the amplified signal; and
a control component configured to one or both of (i) receive supervisory information from one or more external components, and (ii) distribute control and parametric information to at least one of the chemically-sensitive VeSFET, the amplifier and the ADC.

* * * * *